US009215805B2

(12) United States Patent
Zanma et al.

(10) Patent No.: US 9,215,805 B2
(45) Date of Patent: Dec. 15, 2015

(54) WIRING BOARD WITH BUILT-IN ELECTRONIC COMPONENT AND METHOD FOR MANUFACTURING THE SAME

(71) Applicant: IBIDEN CO., LTD., Ogaki-shi (JP)

(72) Inventors: Masahiro Zanma, Ogaki (JP); Toshiki Furutani, Ogaki (JP); Yukinobu Mikado, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 310 days.

(21) Appl. No.: 13/749,059

(22) Filed: Jan. 24, 2013

(65) Prior Publication Data

US 2013/0284506 A1   Oct. 31, 2013

Related U.S. Application Data

(60) Provisional application No. 61/639,285, filed on Apr. 27, 2012.

(51) Int. Cl.
| H05K 1/16 | (2006.01) |
| H05K 1/11 | (2006.01) |
| H05K 7/00 | (2006.01) |
| H05K 1/18 | (2006.01) |
| H05K 3/30 | (2006.01) |
| H05K 3/46 | (2006.01) |

(52) U.S. Cl.
CPC .............. H05K 1/115 (2013.01); H05K 1/185 (2013.01); H05K 3/305 (2013.01); *H05K 3/4602* (2013.01); *H05K 3/4652* (2013.01); *H05K 2201/0195* (2013.01); *H05K 2201/10015* (2013.01); *H05K 2201/10636* (2013.01); *H05K 2203/1469* (2013.01); *Y10T 29/4913* (2015.01)

(58) Field of Classification Search
USPC ........................................................ 174/260
See application file for complete search history.

(56) References Cited

U.S. PATENT DOCUMENTS

| 7,501,584 B2 * | 3/2009 | Hashimoto et al. ........... 174/259 |
| 7,923,645 B1 * | 4/2011 | Huemoeller et al. ......... 174/255 |
| 9,040,843 B2 * | 5/2015 | Toyoda et al. ................. 174/262 |

(Continued)

FOREIGN PATENT DOCUMENTS

| JP | 2001-345560 | 12/2001 |
| JP | 2007258542 A | * 10/2007 |

OTHER PUBLICATIONS

English Machine Translation of Muramatsu (JP 2007258542A) provided with Office Action.*

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A wiring board including a substrate having opening penetrating from first to second surfaces, an electronic component in the opening having first and second electrodes, a first insulation layer over the first surface, a second insulation layer over the second surface, a first via conductor in the first layer having bottom connected to the first electrode, a second via conductor in the first layer having bottom connected to the second electrode, a third via conductor in the second layer having bottom connected to the first electrode, and a fourth via conductor in the second layer having bottom connected to the second electrode. The first conductor is longer than the third conductor and has the bottom having greater width than the bottom of the third conductor, and the second conductor is longer than the fourth conductor and has the bottom having greater width than the bottom of the fourth conductor.

17 Claims, 21 Drawing Sheets

(56) References Cited

U.S. PATENT DOCUMENTS

| | | | |
|---|---|---|---|
| 2008/0107863 A1* | 5/2008 | Ikeda et al. | 428/137 |
| 2009/0244865 A1* | 10/2009 | Tanaka | 361/764 |
| 2010/0224397 A1* | 9/2010 | Shimizu et al. | 174/260 |
| 2011/0180908 A1* | 7/2011 | Naganuma et al. | 438/479 |

* cited by examiner

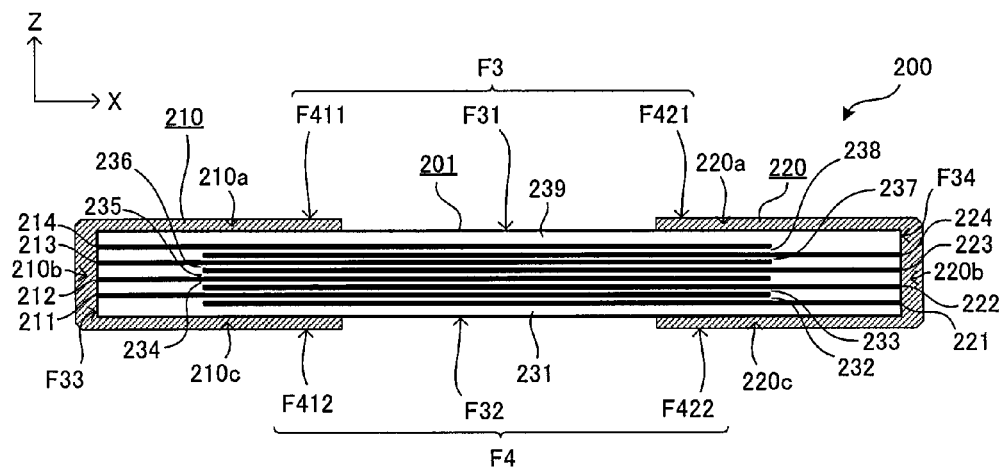

WIRING BOARD WITH BUILT-IN ELECTRONIC COMPONENT AND METHOD FOR MANUFACTURING THE SAME

CROSS-REFERENCE TO RELATED APPLICATIONS

The present application is based upon and claims the benefit of priority from U.S. Application No. 61/639,285, filed Apr. 27, 2012, the entire contents of which are incorporated herein by reference.

BACKGROUND OF THE INVENTION

1. Field of the Invention

The present invention relates to a wiring board with a built-in electronic component and its manufacturing method.

2. Description of Background Art

In Japanese Laid-Open Patent Publication No. 2001-345560, a wiring board with a built-in capacitor is described. The entire contents of this publication are incorporated herein by reference.

SUMMARY OF THE INVENTION

According to one aspect of the present invention, a wiring board has a substrate having an opening portion penetrating from a first surface of the substrate to a second surface of the substrate on the opposite side with respect to the first surface of the substrate, an electronic component positioned in the opening portion and having a first side electrode and a second side electrode such that the first side electrode and the second side electrode extend from a first surface of the electronic component to a second surface of the electronic component on the opposite side with respect to the first surface of the electronic component, insulation layers including a first insulation layer formed over the first surface of the substrate and the first surface of the electronic component and a second insulation layer formed over the second surface of the substrate and the second surface of the electronic component, and via conductors including a first via conductor formed in the first insulation layer and having a bottom surface connected to the first side electrode, a second via conductor formed in the first insulation layer and having a bottom surface connected to the second side electrode, a third via conductor formed in the second insulation layer and having a bottom surface connected to the first side electrode, and a fourth via conductor formed in the second insulation layer and having a bottom surface connected to the second side electrode. The first via conductor has a length which is set longer than a length of the third via conductor, the bottom surface of the first via conductor has a width which is formed greater than a width of the bottom surface of the third via conductor, the second via conductor has a length which is set longer than a length of the fourth via conductor, and the bottom surface of the second via conductor has a width which is greater than a width of the bottom surface of the fourth via conductor.

According to another aspect of the present invention, a method for manufacturing a wiring board includes forming an opening portion through a substrate such that the opening portion penetrates from a first surface of the substrate to a second surface of the substrate on the opposite side with respect to the first surface, positioning in the opening portion of the substrate an electronic component having a first side electrode and a second side electrode, the first side electrode and the second side electrode extending from a first surface of the electronic component to a second surface of the electronic component on the opposite side with respect to the first surface of the electronic component, forming on the substrate insulation layers including a first insulation layer over the first surface of the substrate and the first surface of the electronic component and a second insulation layer over the second surface of the substrate and the second surface of the electronic component, and forming via conductors including a first via conductor and a second via conductor in the first insulation layer such that the first via conductor has a bottom surface connected to the first side electrode and the second via conductor has a bottom surface connected to the second side electrode and a third via conductor and a fourth via conductor in the second insulation layer such that the third via conductor has a bottom surface connected to the first side electrode and the fourth via conductor has a bottom surface connected to the second side electrode. The first via conductor has a length which is set longer than a length of the third via conductor, the bottom surface of the first via conductor has a width which is formed greater than a width of the bottom surface of the third via conductor, the second via conductor has a length which is set longer than a length of the fourth via conductor, and the bottom surface of the second via conductor has a width which is greater than a width of the bottom surface of the fourth via conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A is a view showing a first cross-sectional shape of a chip capacitor to be built into a wiring board according to the embodiment of the present invention;

FIG. 4B is a view showing a second cross-sectional shape of a chip capacitor to be built into a wiring board according to the embodiment of the present invention;

DETAILED DESCRIPTION OF THE EMBODIMENTS

Figure 1:
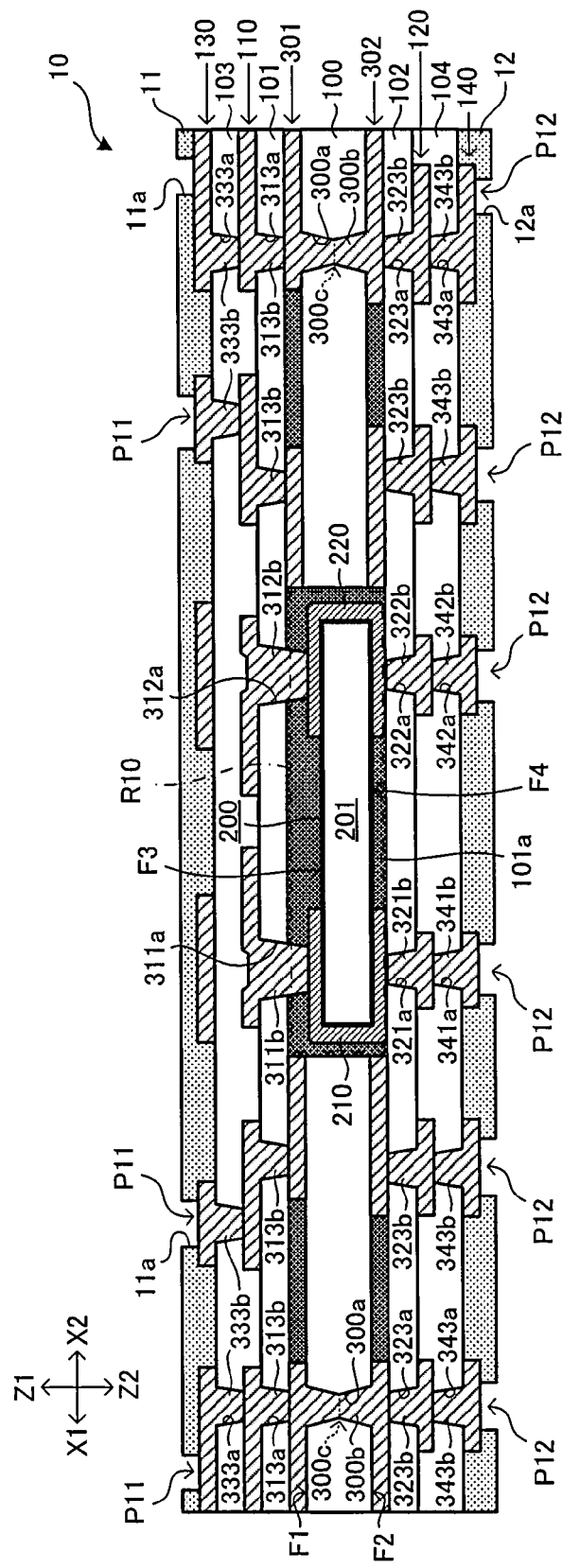
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the drawings, arrows ($Z1$, $Z2$) each indicate a lamination direction in a wiring board (or a thickness direction of the wiring board) corresponding to a direction along a normal line to the main surfaces (upper and lower surfaces) of the wiring board. On the other hand, arrows ($X1$, $X2$) and ($Y1$, $Y2$) each indicate a direction perpendicular to a lamination direction (or a direction to a side of each layer). The main surfaces of the wiring board are on the X-Y plane. Side surfaces of the wiring board are on the X-Z plane or the Y-Z plane. In lamination directions, a side closer to the core is referred to as a lower layer (or an inner-layer side), and a side farther from the core as an upper layer (or an outer-layer side).

A conductive layer is formed with one or multiple conductive patterns. A conductive layer may include a conductive pattern that forms an electrical circuit such as wiring (including ground), a pad, a land or the like. A conductive layer may include a planar conductive pattern that does not form an electrical circuit.

Opening portions include notches and cuts other than holes and grooves. Holes are not limited to penetrating holes, and non-penetrating holes are also referred to as holes. Holes include via holes and through holes. Hereinafter, conductor formed in a via hole (wall surface or bottom surface) is referred to as a via conductor, and conductor formed in a through hole (wall surface) is referred to as a through-hole conductor.

Being stacked means a via conductor is formed on the land of another via conductor formed in its lower layer. Namely, if the bottom surface of a via conductor is not set off from the land of another via conductor formed in its lower layer, that indicates the via conductors are stacked.

Plating includes wet plating such as electrolytic plating as well as dry plating such as PVD (physical vapor deposition) and CVD (chemical vapor deposition).

A side electrode of an electronic component is an electrode that is formed at least on part of a side surface of the electronic component.

Unless otherwise specified, the "width" of a hole or a column (protrusion) means the diameter if it is a circle, or $2\sqrt{(\text{cross section}/\pi)}$ if it is other than a circle.

In the following, an embodiment of the present invention is described in detail with reference to the drawings.

Figure 2:
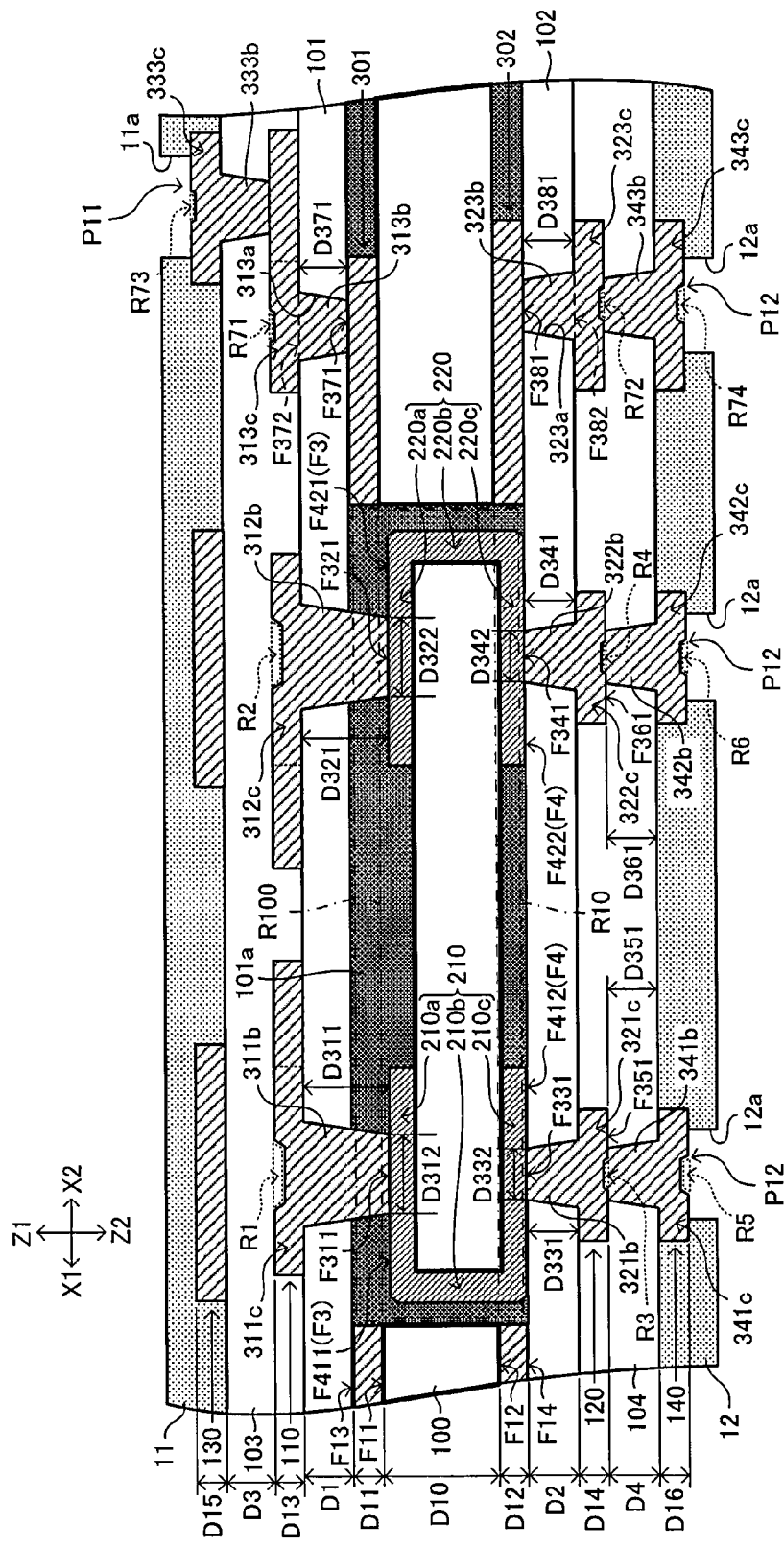
FIG. 2 is a partially enlarged view of FIG. 1.

As shown in FIG. 1 and FIG. 2 (partially enlarged view of FIG. 1), wiring board 10 of the present embodiment (wiring board with a built-in electronic component) has substrate 100 (insulative substrate), through-hole conductor (300b), insulation layers (101, 102, 103, 104) (each an interlayer insulation layer), conductive layers (301, 302, 110, 120, 130, 140), electronic component 200, via conductors (311b, 312b, 313b, 321b, 322b, 323b, 333b, 341b, 342b, 343b), and solder resists (11, 12). Wiring board 10 of the present embodiment is a rigid wiring board in a rectangular shape, for example. However, that is not the only option, and wiring board 10 may be in any other shape than rectangular, and may be a flexible wiring board.

In the present embodiment, substrate 100 is the core substrate of wiring board 10. Opening section (R100) (FIG. 2) is formed in substrate 100. Electronic component 200 is built into the core substrate of wiring board 10 by being positioned in opening section (R100). In wiring board 10 of the present embodiment, substrate 100, through-hole conductor (300b), conductive layers (301, 302) and electronic component 200 make the core section. In the following, one of the upper and lower surfaces (two main surfaces) of substrate 100 is referred to as first surface (F1) and the other as second surface (F2). Also, of the upper and lower surfaces (two main surfaces) of electronic component 200, the surface facing the same direction as first surface (F1) is referred to as third surface (F3), and the other as fourth surface (F4).

Conductive layers, interlayer insulation layers and via conductors laminated on the core substrate correspond to buildup sections. In the following, a buildup section in a lowermost position is referred to as a lower buildup section, and a buildup section positioned farther up than the lower buildup section is referred to as an upper buildup section. In the present embodiment, the lower buildup sections are formed with insulation layers (101, 102), conductive layers (110, 120) and via conductors (311b, 312b, 313b, 321b, 322b, 323b). Also, the upper buildup sections are formed with insulation layers (103, 104), conductive layers (130, 140) and via conductors (333b, 341b, 342b, 343b).

Through hole (300a) is formed in substrate 100 (core substrate), and through-hole conductor (300b) is formed by filling conductor (such as copper plating) in through hole (300a). Through-hole conductor (300b) is shaped like an hourglass, for example. Namely, through-hole conductor (300b) has narrowed portion (300c), the width of through-hole conductor (300b) gradually decreases as it comes closer to narrowed portion (300c) from first surface (F1), and also gradually decreases as it comes closer to narrowed portion (300c) from second surface (F2). However, that is not the only option, and through-hole conductor (300b) may have any other shape; for example, it may have a substantially columnar shape.

Conductive layer 301 is formed on first surface (F1) of substrate 100, and conductive layer 302 is formed on second surface (F2) of substrate 100. Conductive layer 301 and conductive layer 302 are electrically connected to each other by through-hole conductor (300b). Conductive layers (301, 302) are each electrically connected to power source or ground, for example.

Substrate 100 has opening section (R100) (a hole, for example) that penetrates from first surface (F1) to second surface (F2) of substrate 100 (see FIG. 2). By forming opening section (R100) in substrate 100, cavity (R10) (accommodation section) is formed in the core section of wiring board 10, having a thickness from upper surface (F13) of conductive layer 301 formed on one side of substrate 100 to upper surface (F14) of conductive layer 302 formed on the other side. In the present embodiment, cavity (R10) is formed as a hole that penetrates through substrate 100. Cavity (R10) opens on first surface (F1) and on its opposing second surface (F2) respectively. Cavity (R10) is formed by a laser. The planar shape of cavity (R10) (including its measurements) is the same as that of opening section (R100).

Insulation layer 101 is formed on first surface (F1) of substrate 100 and on conductive layer 301. Insulation layer 102 is formed on second surface (F2) of substrate 100 and on conductive layer 302. Conductive layer 110 is formed on insulation layer 101, and conductive layer 120 is formed on insulation layer 102.

In the present embodiment, the thickness of cavity (R10) (the sum of the thickness of substrate 100, the thickness of conductive layer 301 and the thickness of conductive layer 302) is greater than the thickness of electronic component 200 including the external electrodes (the sum of the thickness of body 201, the thickness of upper portion (210a) or (220a) and the thickness of lower portion (210c) or (220c)). Therefore, entire electronic component 200 is accommodated in cavity (R10). In addition, by setting the sum of the thickness of substrate 100, the thickness of conductive layer 301 and the thickness of conductive layer 302 to be greater than the thickness of electronic component 200, wiring board 10 of the present embodiment (wiring board with a built-in electronic component) seldom warps.

Electronic component 200 is positioned in a side direction (direction X or direction Y) of substrate 100 by being positioned in cavity (R10). Insulator (101a) is filled between electronic component 200 in cavity (R10), substrate 100 and insulation layers (101, 102) respectively. In the present embodiment, insulator (101a) is made mainly of the insulative material (resin containing core material, for example) that forms insulation layer 101 (resin insulation layer, for example). However, that is not the only option, and insulator (101a) may be made of any other material. For example, another insulative material is separately prepared and is filled in gaps in cavity (R10).

In the present embodiment, upper surface (F13) of conductive layer 301 and third surface (F3) of electronic component 200 (in particular, later-described first electrode surfaces (F411, F421)) are at different heights (Z coordinates) from each other as shown in FIG. 2. Thus, a gap is formed between insulation layer 101 and electronic component 200. Insulator (101a) is filled in the gap. By contrast, upper surface (F14) of conductive layer 302 and fourth surface (F4) of electronic component 200 (especially, later-described second electrode surfaces (F412, F422)) have substantially the same heights (Z coordinates) as each other, forming an even plane. Thus, when manufacturing wiring board 10 of the present embodiment, it is easy for electronic component 200 to be mounted on (built into) the wiring board by using a support plate (such as carrier 1005) (see later-described FIG. 19~FIG. 26). As a result, even when a thin electronic component is built into wiring board 10 of the present embodiment, the manufacturing process seldom becomes complex. Accordingly, a wiring board with a built-in electronic component is manufactured by such a method that makes it possible to maintain low cost, high throughput, high yield and the like.

Insulation layer 101 and insulator (101a) (each the first insulation layer) are formed on third surface (F3) of electronic component 200, and insulation layer 102 (second insulation layer) is formed on fourth surface (F4) of electronic component 200. Insulation layer 101 covers one opening (on the first-surface (F1) side) of cavity (R10), and insulation layer 102 covers the other opening (on the second-surface (F2) side) of cavity (R10).

Insulation layer 103 is formed on insulation layer 101 and on conductive layer 110, and insulation layer 104 is formed on insulation layer 102 and on conductive layer 120. Conductive layer 130 is formed on insulation layer 103, and conductive layer 140 is formed on insulation layer 104. In the present embodiment, conductive layers (130, 140) are outermost layers. However, that is not the only option, and more interlayer insulation layers and conductive layers may further be laminated.

Holes (311a, 312a, 313a) (via holes) are formed in insulation layer 101, and holes (321a, 322a, 323a) (via holes) are formed in insulation layer 102. Hole (333a) (via hole) is formed in insulation layer 103, and holes (341a, 342a, 343a) (via holes) are formed in insulation layer 104. Then, by filling a conductor (copper plating, for example) in each hole, the conductor in each hole becomes respectively via conductors (311b, 312b, 313b, 321b, 322b, 323b, 333b, 341b, 342b, 343b) (each a filled conductor). Via conductors (311b, 312b, 321b, 322b, 341b, 342b, 313b, 323b, 333b, 343b) respectively have land (311c) with recessed portion (R1), land (312c) with recessed portion (R2), land (321c) with recessed portion (R3), land (322c) with recessed portion (R4), land (341c) with recessed portion (R5), land (342c) with recessed portion (R6), land (313c) with recessed portion (R71), land (323c) with recessed portion (R72), land (333c) with recessed portion (R73), and land (343c) with recessed portion (R74).

Via conductor (311b) is connected to electrode 210 (in particular, later-described upper portion (210a)) of electronic component 200, and via conductor (312b) is connected to electrode 220 (in particular, later-described upper portion (220a)) of electronic component 200. Also, via conductor (321b) is connected to electrode 210 (in particular, later-described lower portion (210c)) of electronic component 200, and via conductor (322b) is connected to electrode 220 (in particular, later-described lower portion (220c)) of electronic component 200. Via conductors (311b, 312b) are each formed in insulation layer 101, and via conductors (321b, 322b) are each formed in insulation layer 102. In the present embodiment, both surfaces (third surface (F3) and fourth surface (F4) respectively) of electronic component 200 are connected to via conductors, as described above. In the following, such a structure is referred to as a double-sided via structure.

Regarding the via conductors connected to electrode 210 and via conductors connected to electrode 220 in wiring board 10 of the present embodiment, the number of via conductors formed in insulation layer 101 is the same as the number of via conductors formed in insulation layer 102. In particular, among the via conductors connected to electrode 210, one via conductor is formed in insulation layer 101 (via conductor (311b)), and one via conductor is formed in insulation layer 102 (via conductor (321b)). Also, among the via conductors connected to electrode 220, one via conductor is formed in insulation layer 101 (via conductor (312b)), and one via conductor is formed in insulation layer 102 (via conductor (322b)). In addition, via conductor (311b) and via conductor (321b) are formed in positions to face each other by sandwiching electronic component 200 (in the same XY coordinates), and via conductor (312b) and via conductor (322b) are formed in positions to face each other by sandwiching electronic component 200 (in the same XY coordinates) (see later-described FIG. 6).

Because of the above described double-sided via structure, conductive layer 110 and conductive layer 120 are electrically connected to each other by electrode 210 of electronic component 200 and via conductors (311b, 321b) or electrode 220 of electronic component 200 and via conductors (312b, 322b) in wiring board 10 of the present embodiment. Accordingly, the conductive layer on the first-surface (F1) side of substrate 100 and the conductive layer on the second-surface (F2) side of substrate 100 are electrically connected to each other without forming through holes in substrate 100. As a result, it is easier to secure a wiring region on substrate 100. Also, because electrical connections are formed in the inner layers of such a structure, it is advantageous for miniaturization. In addition, heat dissipation of the built-in electronic component is improved in such a wiring board with a built-in electronic component having a double-sided via structure, when compared with a wiring board with a built-in electronic component having a single-sided via structure.

Other via conductors (341b, 342b) are respectively stacked with via conductors (321b, 322b). Specifically, via conductors (341b, 342b) are respectively positioned directly on via conductors (321b, 322b) (in direction Z). Via conductor (321b) and via conductor (341b) above it touch each other and are electrically connected. Also, via conductor (322b) and via conductor (342b) above it touch each other and are electrically connected. In the present embodiment, axes in direction Z of via conductors (321b, 341b) stacked as described above substantially overlap each other, and axes in direction Z of via conductors (322b, 342b) stacked as described above substantially overlap each other. Here, the axis of a via conductor in direction Z corresponds to a line in direction Z that passes the gravity center of each X-Y cross section of the via conductor (the center if it is a circle).

On the other hand, no via conductor is stacked with via conductors (311b, 312b).

Also, one each of via conductors (313b, 323b, 333b, 343b) is positioned directly on through-hole conductor (300b) (in direction Z), and adjacent conductors touch each other. Accordingly, a through-hole conductor and a via conductor, or adjacent via conductors, are electrically connected to each other. In the present embodiment, via conductors (313b, 323b, 333b, 343b) and through-hole conductor (300b) are each a filled conductor and they are stacked in direction Z. Such a stacked structure is advantageous for miniaturization. In the present embodiment, the axes in direction Z of via conductors (313b, 323b, 333b, 343b) and through-hole conductor (300b) stacked as described above substantially overlap each other.

Conductive layer 301 and conductive layer 110 are electrically connected to each other by via conductor (313b), and conductive layer 302 and conductive layer 120 are electrically connected to each other by via conductor (323b). Also, conductive layer 110 and conductive layer 130 are electrically connected to each other by via conductor (333b), and conductive layer 120 and conductive layer 140 are electrically connected to each other by via conductors (341b, 342b, 343b).

Solder resists (11, 12) are formed respectively on conductive layers (130, 140) (each an outermost conductive layer). However, opening portions (11a, 12a) are formed in solder resists (11, 12). Thus, predetermined portions (portions corresponding to opening portion (11a)) of conductive layer 130 are exposed without being covered by solder resist 11, and become pads (P11). Also, predetermined portions (portions corresponding to opening portions (12a)) of conductive layer 140 become pads (P12). Pads (P11) become external connection terminals for electrical connection with another wiring board, for example, and pads (P12) become external connection terminals for mounting an electronic component, for example. However, those are not the only options, and pads (P11, P12) may be used for any other purposes.

Wiring board 10 of the present embodiment has pads (P11, P12) (external connection terminals) directly on electronic component 200 (in direction Z). Also, wiring board 10 has pads (P11, P12) (external connection terminals) directly on substrate 100 (in direction Z). Pads (P11, P12) have anticorrosion layers made of Ni/Au film, for example, on their surfaces. Anticorrosion layers may be formed by electrolytic plating, sputtering or the like. Anticorrosion layers made of organic protection film may also be formed by performing an OSP treatment. Anticorrosion layers are not always required, and may be omitted unless necessary.

In the present embodiment, the outermost conductive layer laminated on the first-surface (F1) side of substrate 100 (pads P11) form terminals for mounting another wiring board, and the outermost conductive layer laminated on the second-surface (F2) side of substrate 100 (pads P12) form terminals for mounting an IC (integrated circuit) chip.

Figure 3:
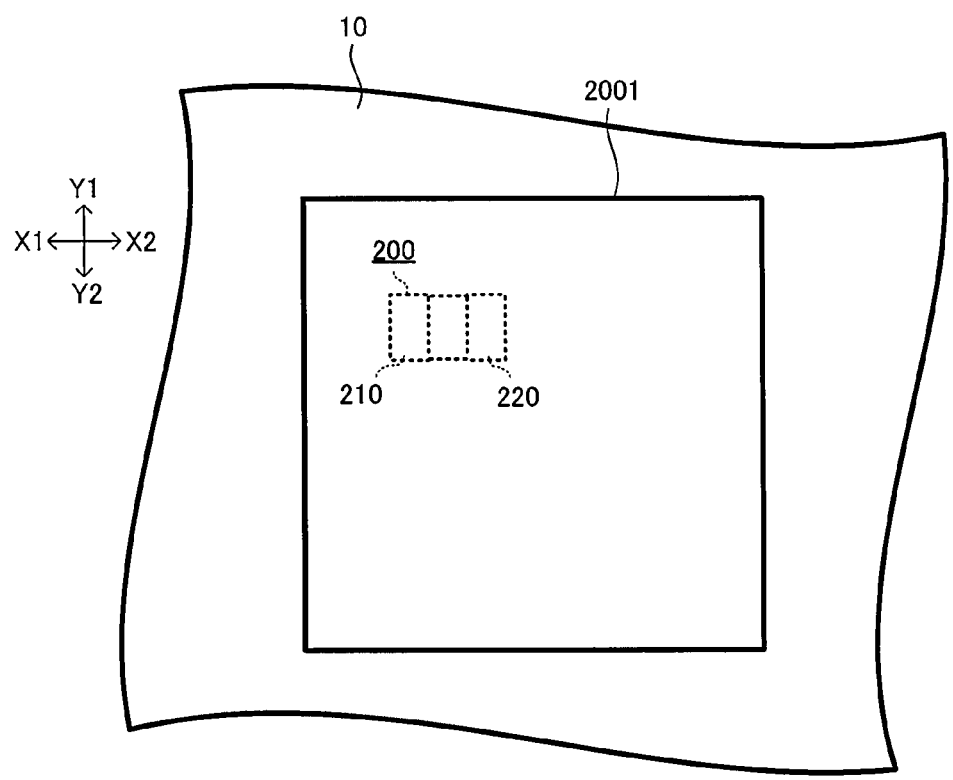
FIG. 3 is a view showing an example where an electronic component is mounted (surface mounted) on a main surface of a wiring board according to an embodiment of the present invention.

Specifically, pads (P11) form a BGA (ball grid array), for example. Wiring board 10 of the present embodiment is mounted on a motherboard, for example, through pads (P11). Also, IC chip 2001 (such as a bear chip) is FC (flip chip) mounted on pads (P12) as shown in FIG. 3, for example.

Figure 5A:
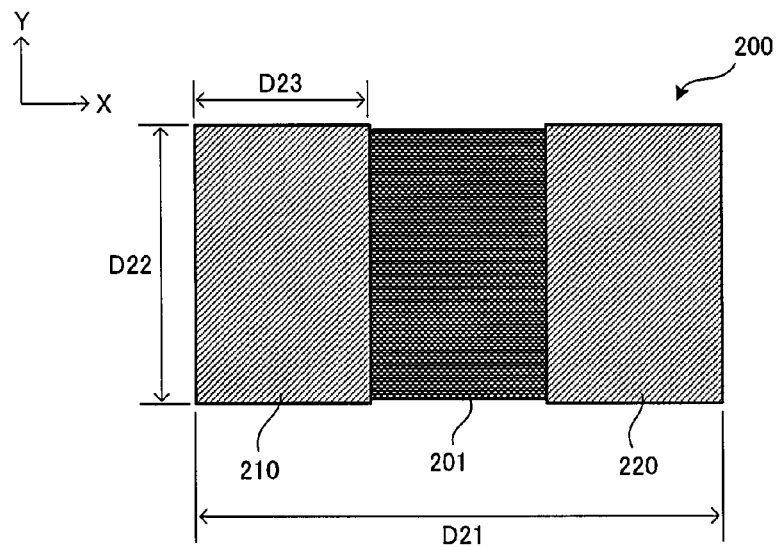
FIG. 5A is a plan view of a chip capacitor to be built into a wiring board according to the embodiment of the present invention.
Figure 5B:
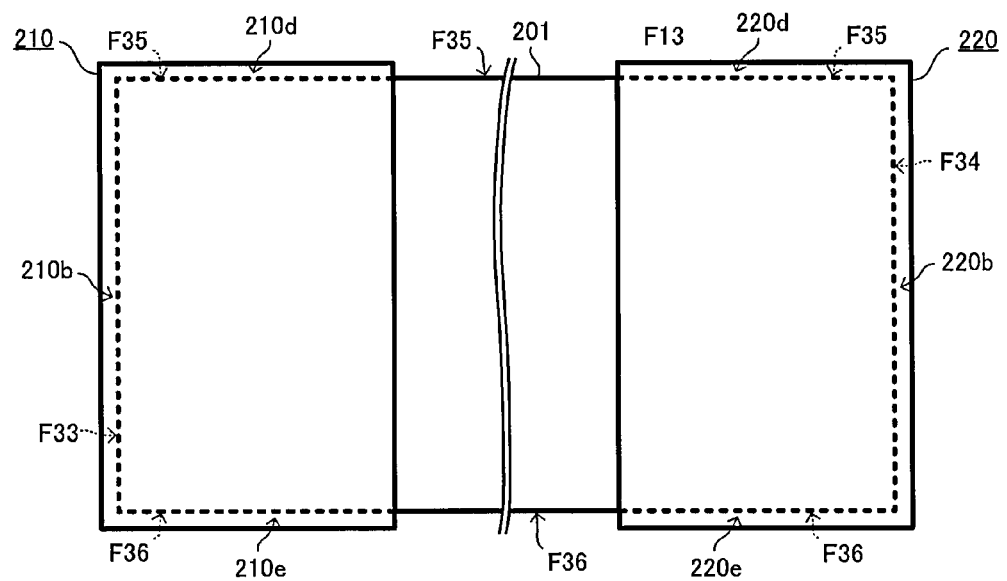
FIG. 5B is a view showing electrodes formed on side surfaces of a chip capacitor to be built into a wiring board according to the embodiment of the present invention.

In the following, the structure of electronic component 200 (chip capacitor) to be built into wiring board 10 of the present embodiment is described with reference to FIGS. 4A~5B. FIG. 4A is a view showing a first cross-sectional shape (X-Z cross section) of electronic component 200. FIG. 4B is a view showing a second cross-sectional shape (Y-Z cross section) of electronic component 200. FIG. 5A is a plan view of electronic component 200. FIG. 5B is a view showing electrodes formed on side surfaces of body 201 of electronic component 200.

Electronic component 200 is a chip-type MLCC (multi-layer ceramic capacitor) as shown in FIGS. 4A~5B, for example. The capacitance of the capacitor is 0.22 μF for example.

Electronic component 200 has body 201 and electrodes (210, 220) (first side electrode and its opposing second side electrode). Body 201 is formed with multiple dielectric layers (231~239) and multiple conductive layers (211~214, 221~224) (each an inner electrode) which are alternately laminated as shown in FIG. 4A. Dielectric layers (231~239) are each made of ceramic, for example. Body 201 has first main surface (F31) and its opposing second main surface (F32) along direction Z; first side surface (F33) and its opposing second side surface (F34) along direction X; and third side surface (F35) and its opposing fourth side surface (F36) along direction Y. First through fourth side surfaces (F33~F36) each connect first main surface (F31) and second main surface (F32).

Electronic component 200 has a pair of side electrodes (electrodes (210, 220)) at both of its end portions. Electrodes (210, 220) each have a cross-sectional U-shape (X-Z cross section) as shown in FIG. 4A. In the present embodiment, as shown in FIGS. 4A and 5B, electrode 210 is formed on first main surface (F31), on second main surface (F32), on first side surface (F33), on third side surface (F35) and on fourth side surface (F36) of body 201; and electrode 220 is formed on first main surface (F31), on second main surface (F32), on second side surface (F34), on third side surface (F35) and on fourth side surface (F36) of body 201.

In the following, portions of electrode 210 formed on first side surface (F33), on third side surface (F35) and on fourth side surface (F36) are referred to respectively as first side portion (210b), third side portion (210d) and fourth side portion (210e) (see FIG. 5B). Portions of electrode 220 formed on second side surface (F34), on third side surface (F35) and on fourth side surface (F36) are referred to respectively as second side portion (220b), third side portion (220d) and fourth side portion (220e) (see FIG. 5B). In addition, portions of electrodes (210, 220) formed on first main surface (F31) are referred to as upper portions (210a, 220a), and portions formed on second main surface (F32) are referred to as lower portions (210c, 220c) (see FIG. 4A).

Electrode 210 is formed with first side portion (210b) which covers entire first side surface (F33) of body 201 along with upper portion (210a), lower portion (210c), third side portion (210d) and fourth side portion (210e) respectively covering part of first main surface (F31) of body 201, part of second main surface (F32), part of third side surface (F35) and part of fourth side surface (F36). Also, electrode 220 is formed with second side portion (220b) which covers entire second side surface (F34) of body 201 along with upper portion (220a), lower portion (220c), third side portion (220d) and fourth side portion (220e) respectively covering part of first main surface (F31) of body 201, part of second main surface (F32), part of third side surface (F35) and part of fourth side surface (F36).

In the following, the upper surface of upper portion (210a) of electrode 210 is referred to as first electrode surface (F411), the upper surface of upper portion (220a) of electrode 220 as first electrode surface (F421), the upper surface of lower portion (210c) of electrode 210 as second electrode surface (F412), and the upper surface of lower portion (220c) of electrode 220 as second electrode surface (F422). As shown in FIG. 4A, third surface (F3) of electronic component 200 is formed with first electrode surface (F411), first main surface (F31), and first electrode surface (F421). Fourth surface (F4) of electronic component 200 is formed with second electrode surface (F412), second main surface (F32), and second electrode surface (F422).

In the present embodiment, upper portion (210a), first side portion (210b), third side portion (210d), fourth side portion (210e) and lower portion (210c) are formed to be integrated with each other in electrode 210; and upper portion (220a), second side portion (220b), third side portion (220d), fourth side portion (220e) and lower portion (220c) are formed to be integrated with each other in electrode 220. Either end of body 201 is covered by electrode 210 or 220 from second main surface (F32) to side surfaces (first side surface (F33), second side surface (F34), third side surface (F35), fourth side surface (F36)) to first main surface (F31). Conductive layers (211~214) (each an inner electrode) are connected to first side portion (210b) (part of electrode 210), and conductive layers (221~224) (each an inner electrode) are connected to second side portion (220b) (part of electrode 220).

Electrodes (210, 220) are positioned at both end portions of electronic component 200. The central portion of body 201 positioned between electrode 210 and electrode 220, as shown in FIG. 4A, is not covered by electrodes (210, 220), and first main surface (F31) and second main surface (F32) of body 201 (in particular, dielectric layers (231, 239)) are exposed.

Figure 6:
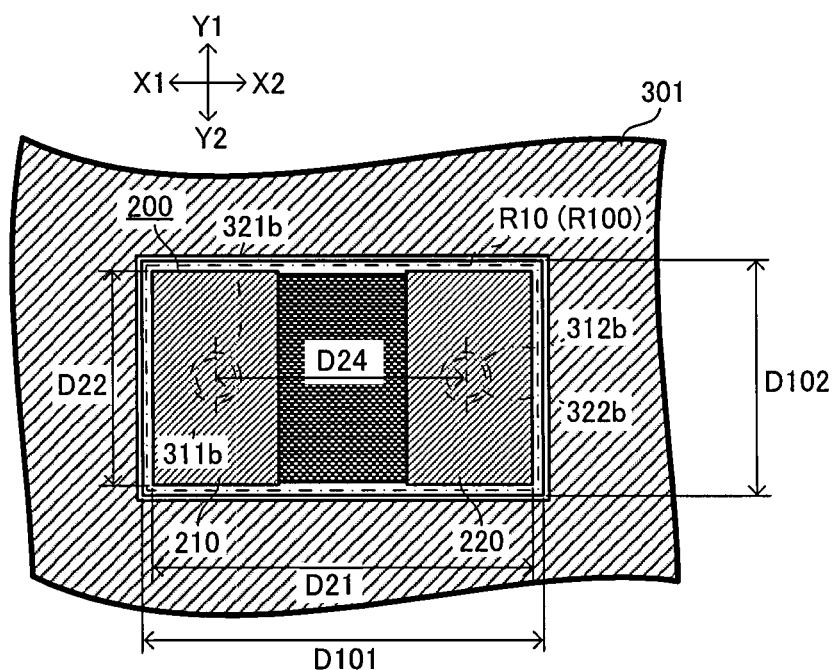
FIG. 6, in a wiring board according to the embodiment of the present invention, is a plan view showing a state when an electronic component is accommodated in a cavity.

FIG. 6 is a view in which electronic component 200 is accommodated in cavity (R10) of the core section.

In wiring board 10 of the present embodiment, the opening shapes on both ends of cavity (R10) (first-surface (F1) side and second-surface (F2) side) are each rectangular as shown in FIG. 6. Electrode 210 is positive (+), for example, and electrode 220 is negative (−), for example. Electrode 210 of electronic component 200 is electrically connected to power source through a die, for example. Also, electrode 220 of electronic component 200 is electrically connected to ground through via conductor (322b) or the like, for example.

As shown in FIGS. 4A~5B, electronic component 200 of the present embodiment has a symmetrical structure in direction X on one end (the electrode 210 side, for example) and the other end (the electrode 220 side, for example). Thus, even if the polarities of electrode 210 and electrode 220 are reversed, electronic component 200 operates. Therefore, when electronic component 200 is positioned in cavity (R10) in wiring board 10 of the present embodiment, there is no need to check the direction of electronic component 200.

In the following, preferred examples of materials for wiring board 10 of the present embodiment are shown.

Substrate 100 is made of resin containing core material in the present embodiment. Specifically, substrate 100 is made by impregnating glass cloth (core material) with epoxy resin (hereinafter referred to as glass epoxy), for example. The thermal expansion coefficient of core material is lower than that of the main material (epoxy resin in the present embodiment). As for core material, for example, glass fiber (such as glass cloth or glass non-woven fabric), aramid fiber (such as aramid non-woven fabric), or inorganic material such as silica filler is considered preferable. However, basically, any material may be selected for substrate 100. For example, substrate 100 may be made of resin that does not contain core material. Also, polyester resin, bismaleimide triazine resin (BT resin), imide resin (polyimide), phenol resin, allyl polyphenylene ether resin (A-PPE resin) or the like may be used instead of epoxy resin. Substrate 100 may be formed with multiple layers of different materials.

In the present embodiment, insulation layers (101, 102, 103, 104) are each made by impregnating core material with resin. Specifically, insulation layers (101, 102, 103, 104) are each made of glass epoxy, for example.

In the present embodiment, insulation layers (101, 102) are each made of resin containing core material. Accordingly, recesses are less likely to be formed in insulation layers (101, 102), suppressing line breakage of conductive patterns formed on insulation layers (101, 102). In addition, electronic component 200 is suppressed from shifting in direction Z, and positional shifting of electronic component 200 seldom occurs in direction Z. However, impact on the core section may increase during pressing procedures.

However, the above settings are not the only options. For example, insulation layers (101, 102, 103, 104) may be made of resin that does not contain core material. Basically, the material for insulation layers (101, 102, 103, 104) is not limited specifically. For example, polyester resin, bismaleimide triazine resin (BT resin), imide resin (polyimide), phenol resin, allyl polyphenylene ether resin (A-PPE resin) or the like may also be used instead of epoxy resin. Each insulation layer may be formed with multiple layers of different materials.

In the present embodiment, via conductors (311b, 312b, 313b, 321b, 322b, 323b, 333b, 341b, 342b, 343b) are each made of copper plating, for example. Via conductors are each shaped to be a tapered column (truncated cone) that tapers with a diameter increasing from the core section toward their respective upper layers, for example. However, that is not the only option, and the shape of via conductors may be determined freely.

Conductive layers (110, 120, 130, 140) are each made of copper foil (lower layer) and copper plating (upper layer), for example. Conductive layers (110, 120, 130, 140) each include wiring that forms an electrical circuit, a land, a planar conductive pattern to improve the strength of wiring board 10, and the like, for example.

The material for each conductive layer and each via conductor is selected freely as long as it is conductive; it may be metallic or non-metallic. Each conductive layer and each via conductor may be formed with multiple layers of different materials.

As shown in FIGS. 1 and 2, wiring board 10 of the present embodiment has the following: substrate 100 with first surface (F1) and its opposing second surface (F2) and having opening section (R100) penetrating from first surface (F1) to second surface (F2); electronic component 200 which is positioned in opening section (R100) and has third surface (F3) facing the same direction as first surface (F1), its opposing fourth surface (F4), electrode 210 (first side electrode) and its opposing electrode 220 (second side electrode); insulation layer 101 and insulator (101a) (each a first insulation layer) formed on third surface (F3) of electronic component 200; insulation layer 102 (second insulation layer) formed on fourth surface (F4) of electronic component 200; via conductor (311b) (first via conductor) formed in insulation layer 101 and insulator (101a) (each a first insulation layer) with its bottom surface (F311) connected to electrode 210 (first side electrode); via conductor (312b) (second via conductor) formed in insulation layer 101 and insulator (101a) (each a first insulation layer) with its bottom surface (F321) connected to electrode 220 (second side electrode); via conductor (321b) (third via conductor) formed in insulation layer 102 (second insulation layer) with its bottom surface (F331) connected to electrode 210 (first side electrode); via conductor (322b) (fourth via conductor) formed in insulation layer 102 (second insulation layer) with its bottom surface (F341) connected to electrode 220 (second side electrode); via conductor (313b) (fifth via conductor) formed in insulation layer 101 (first insulation layer) and connected to conductive layer 301 (first conductive layer); and via conductor (323b) (sixth via conductor) formed in insulation layer 102 (second insulation layer) and connected to conductive layer 302 (second conductive layer). In the following, the structure of each via conductor in wiring board 10 of the present embodiment is described in detail with reference to FIGS. 7 and 8.

Figure 7:
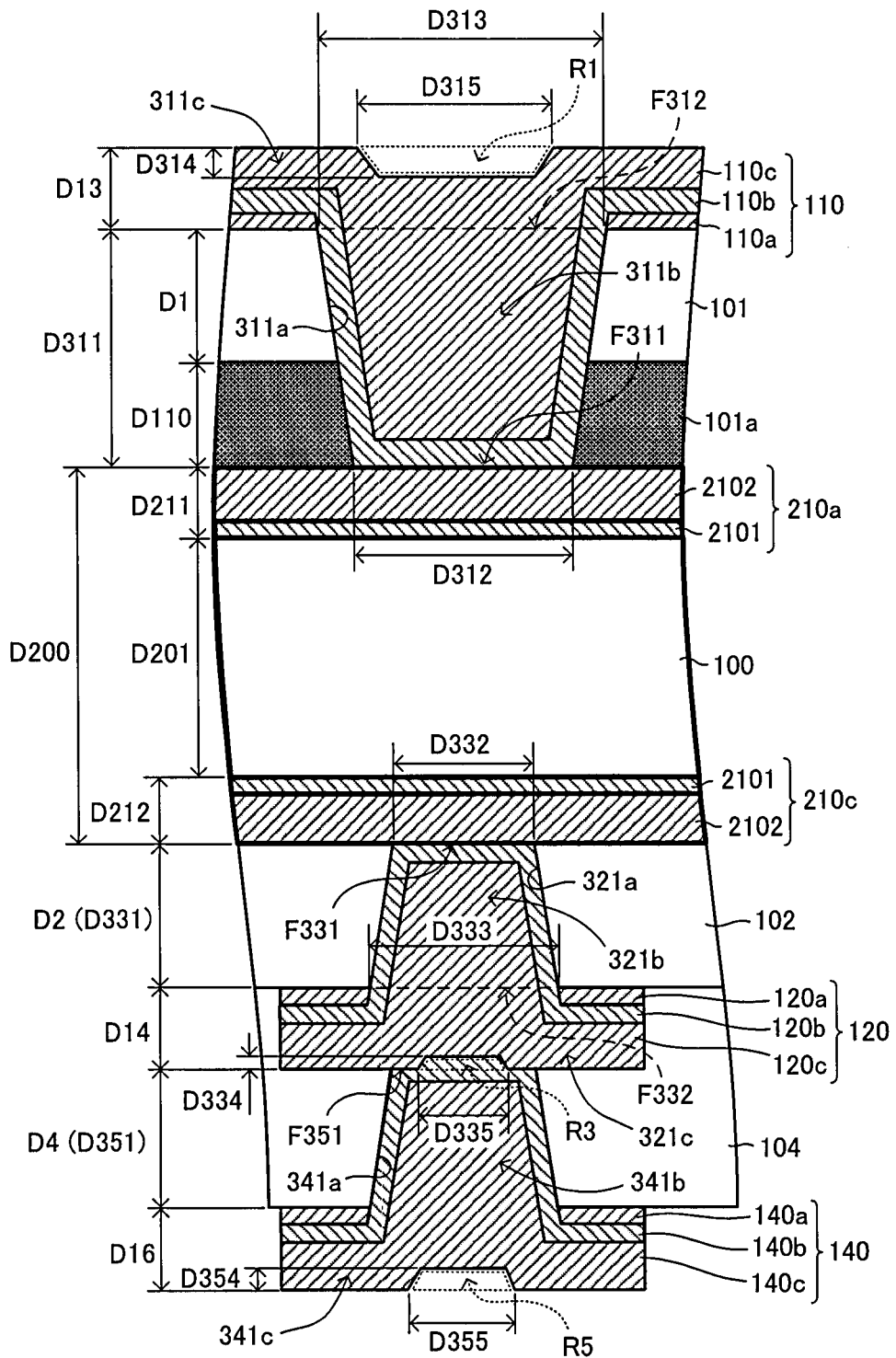
FIG. 7, in the wiring board shown in FIG. 1, is an enlarged cross-sectional view showing a first via conductor and a third via conductor connected to a first side electrode.
Figure 8:
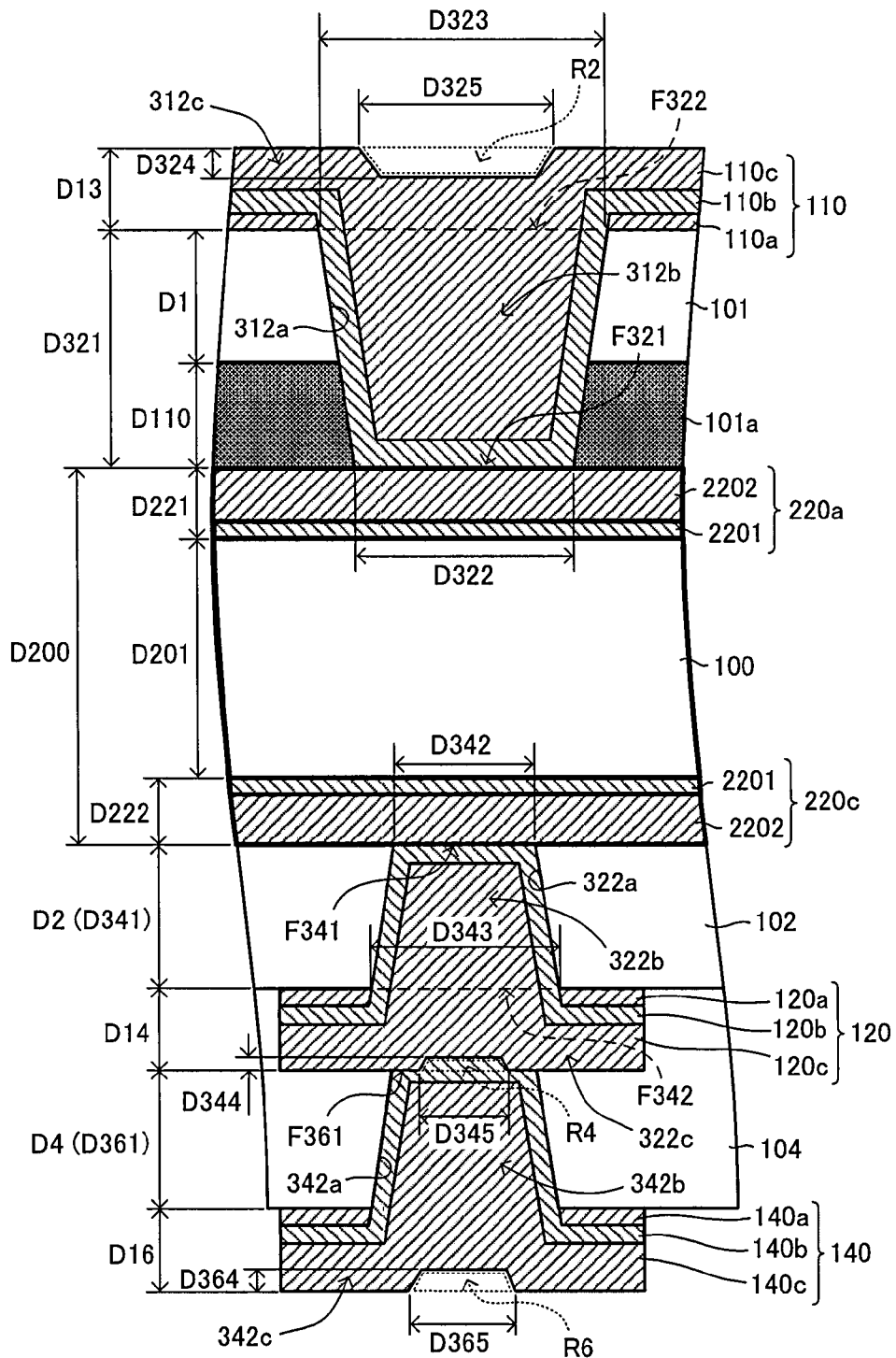
FIG. 8, in the wiring board shown in FIG. 1, is an enlarged cross-sectional view showing a second via conductor and a fourth via conductor connected to a second side electrode.
Figure 9:
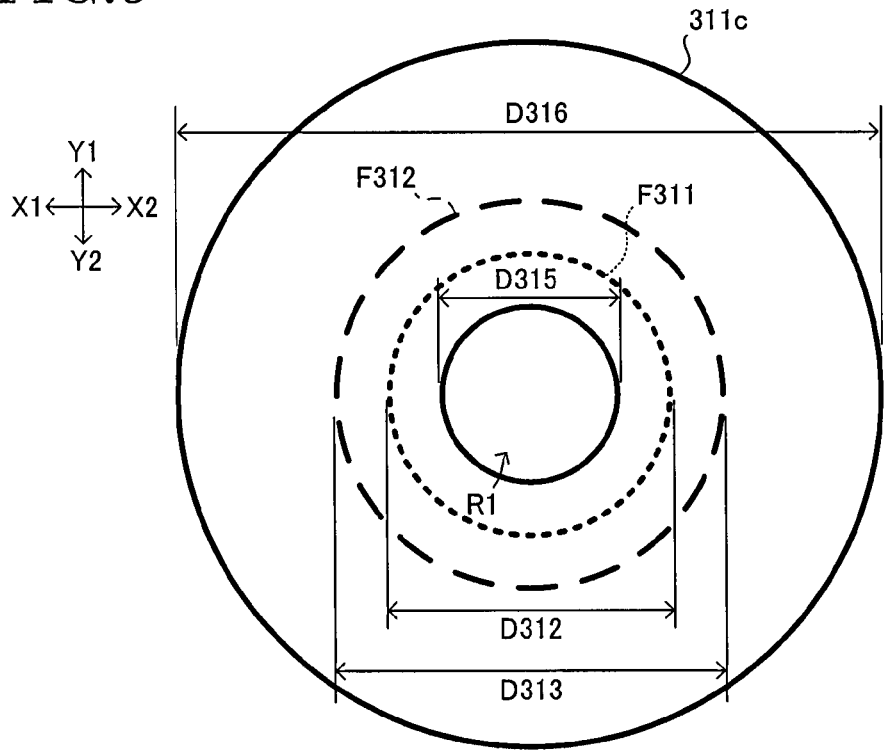
FIG. 9, in the wiring board shown in FIG. 1, is a view showing a first via conductor formed in a first insulation layer and connected to the first side electrode.
Figure 10:
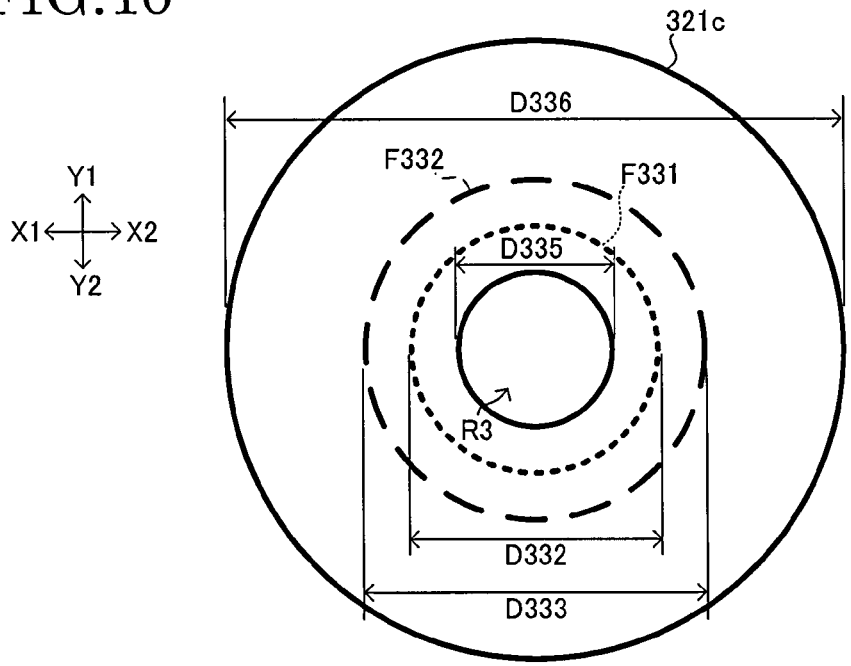
FIG. 10, in the wiring board shown in FIG. 1, is a view showing a third via conductor formed in a second insulation layer and connected to the first side electrode.
Figure 11:
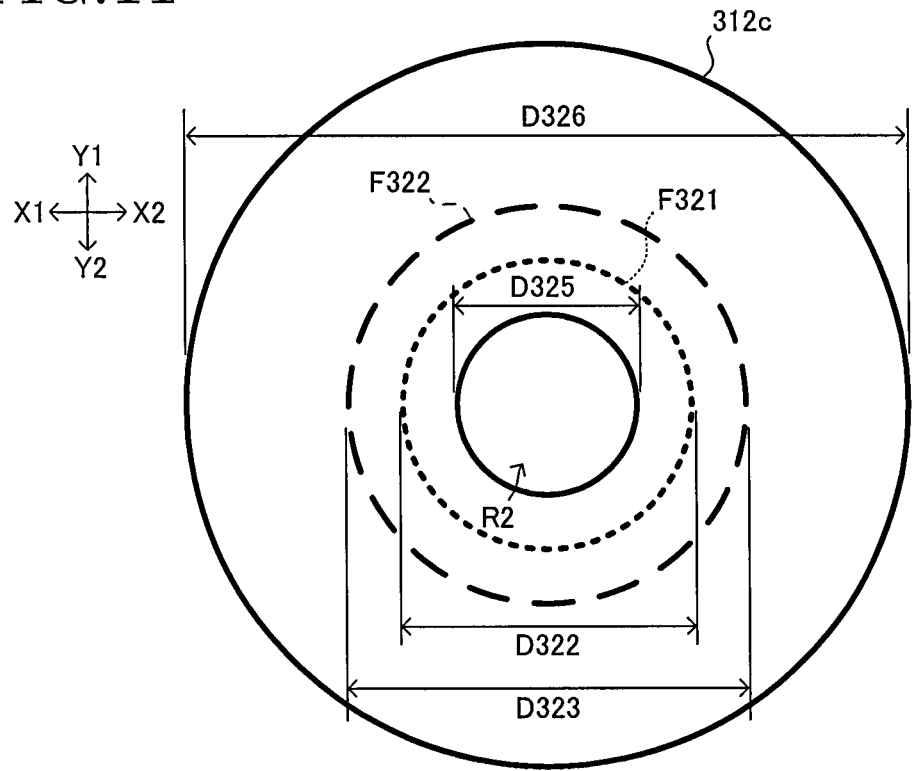
FIG. 11, in the wiring board shown in FIG. 1, is a view showing a second via conductor formed in a first insulation layer and connected to the second side electrode.
Figure 12:
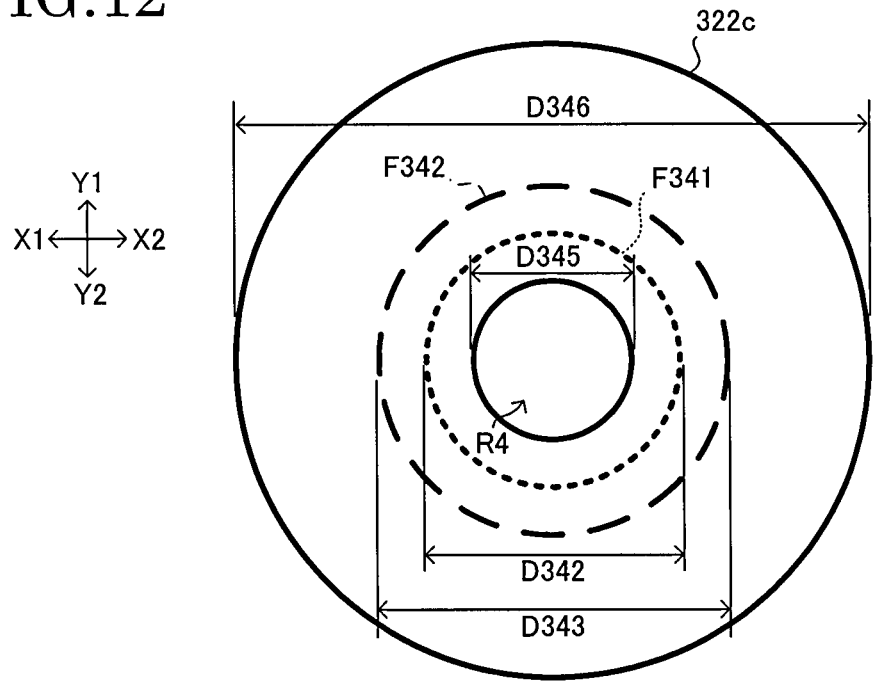
FIG. 12, in the wiring board shown in FIG. 1, is a view showing a fourth via conductor formed in a second insulation layer and connected to the second side electrode.
Figure 13A:
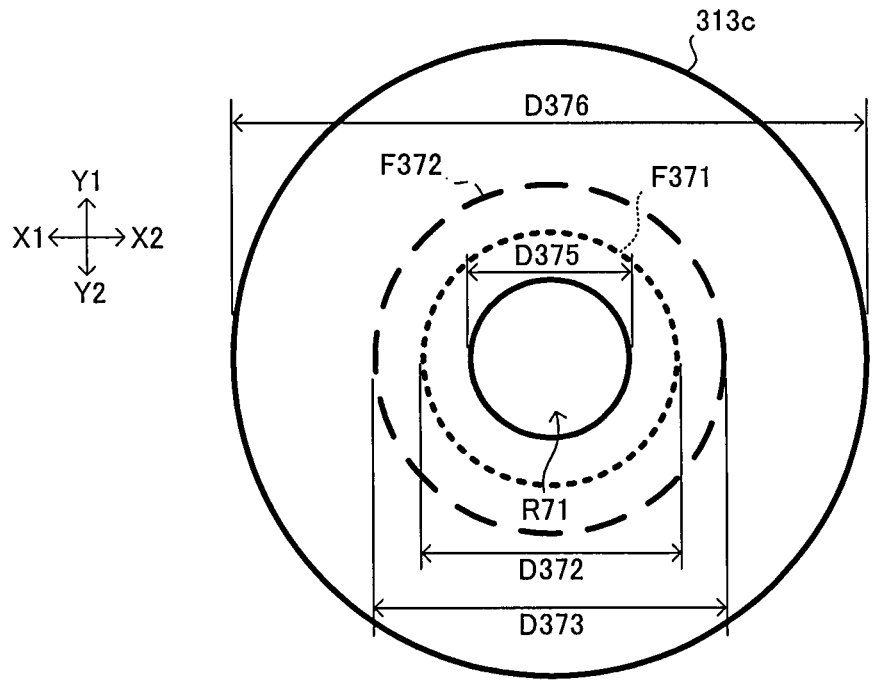
FIG. 13A, in the wiring board shown in FIG. 1, is a view showing a via conductor formed in the first insulation layer and not connected to an electrode of the electronic component.
Figure 13B:
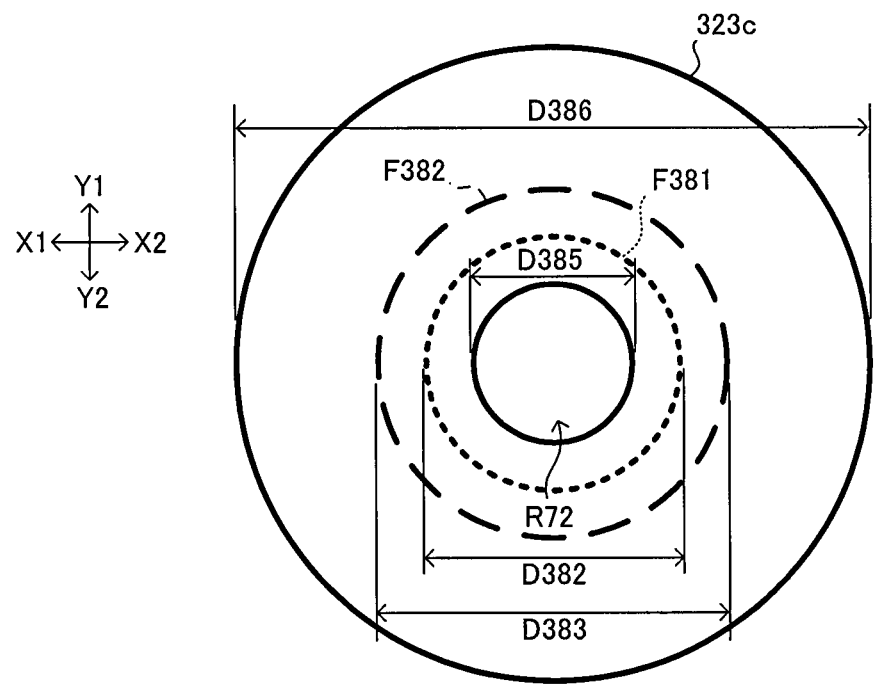
FIG. 13B, in the wiring board shown in FIG. 1, is a view showing a via conductor formed in the second insulation layer and not connected to an electrode of the electronic component.

In FIG. 7 and FIG. 8, length (D311) of via conductor (311b) is greater than length (D331) of via conductor (321b). Also, length (D321) of via conductor (312b) is greater than length (D341) of via conductor (322b). In the present embodiment, length (D331) of via conductor (321b) and length (D341) of via conductor (322b) are each equal to thickness (D2) of insulation layer 102. Length (D311) of via conductor (311b) corresponds to the sum of thickness (D1) of insulation layer 101 and thickness (D110) of insulator (101a).

In addition, width (D312) on bottom surface (F311) of via conductor (311b) is greater than width (D332) on bottom surface (F331) of via conductor (321b). Width (D322) on bottom surface (F321) of via conductor (312b) is greater than width (D342) on bottom surface (F341) of via conductor (322b).

Namely, in wiring board 10 of the present embodiment, via conductor (311b) is longer than via conductor (321b), and bottom surface (F311) of via conductor (311b) has a greater width than bottom surface (F331) of via conductor (321b); and via conductor (312b) is longer than via conductor (322b), and bottom surface (F321) of via conductor (312b) has a greater width than bottom surface (F341) of via conductor (322b). According to such a structure, the width of a longer via conductor on which thermal stress tends to be exerted is greater, increasing the connection reliability of the longer via conductor. As a result, it is easier to secure the required connection reliability of via conductors on both surfaces of electronic component 200, making it easier as well to secure high connection reliability in all the electrical connections (via connections) relating to electronic component 200.

In wiring board 10 of the present embodiment, via conductors (341b, 342b) are stacked respectively on via conductors (321b, 322b), making the distance shorter from electrodes (210, 220) of electronic component 200 (in particular, lower portions (210c, 220c)) to pads (P12) (accordingly, to the IC chip, for example, mounted on the pads). In addition to shorter via conductors (321b, 322b), the above stacked structure further reduces the wiring length. The wiring length between the MLCC and the IC chip is reduced, loop inductance decreases, and high-frequency switching behavior is thought to improve.

Although a stacked structure is effective in reducing wiring length, there is a concern that thermal stress increases on a lower via conductor when via conductors are stacked. For that matter, in wiring board 10 of the present embodiment, via conductors are not stacked on longer via conductors (311b, 312b) on which thermal stress tends to be exerted (upper via conductors are set off from those via conductors). Thermal stress on via conductors (311b, 312b) is suppressed from exceeding a tolerance level by employing such a structure.

In wiring board 10 of the present embodiment, a motherboard is electrically connected to pads (P11), and IC chip 2001 (see FIG. 3) is electrically connected to pads (P12). Thus, electrical resistance or noise is reduced between electronic component 200 and IC chip 2001. As a result, the performance of IC chip 2001 is enhanced.

The ratio of the width on the bottom surface to the length of a via conductor in via conductors (311b, 312b, 321b, 322b) respectively (D312/D311, D322/D321, D332/D331, D342/D341) is preferred to be in a range of 0.5 to 4.0, more preferably in a range of 1.0 to 2.5.

Width (D313) on opening surface (F312) of hole (311a) is greater than width (D333) on opening surface (F332) of hole (321a). Width (D323) on opening surface (F322) of hole (312a) is greater than width (D343) on opening surface (F342) of hole (322a).

In FIG. 2, length (D371) of via conductor (313b) and length (D381) of via conductor (323b) are substantially equal to each other.

In FIGS. 7 and 8, depth (D334) of recessed portion (R3) formed in land (321c) of via conductor (321b) is smaller than depth (D314) of recessed portion (R1) formed in land (311c) of via conductor (311b). Also, depth (D344) of recessed portion (R4) formed in land (322c) of via conductor (322b) is smaller than depth (D324) of recessed portion (R2) formed in land (312c) of via conductor (312b).

In addition, opening width (D335) of recessed portion (R3) is smaller than opening width (D315) of recessed portion (R1). Opening width (D345) of recessed portion (R4) is smaller than opening width (D325) of recessed portion (R2).

It is preferred that the ratio of depth (D334) of recessed portion (R3) to depth (D314) of recessed portion (R1) (D334/D314) be in a range of 0.03 to 0.5, and the ratio of depth (D344) of recessed portion (R4) to depth (D324) of recessed portion (R2) (D344/D324) be in a range of 0.03 to 0.5. Also, it is preferred that the ratio of the former (D334/D314) be in a range of 0.05 to 0.25, and the ratio of the latter (D344/D324) be in a range of 0.05 to 0.25.

In wiring board 10 of the present embodiment, since bottom surface (F311) of via conductor (311b) has a greater width than bottom surface (F331) of via conductor (321b), depth (D314) of recessed portion (R1) formed in land (311c) of via conductor (311b) tends to be greater than depth (D334) of recessed portion (R3) formed in land (321c) of via conductor (321b). Also, since bottom surface (F321) of via conductor (312b) has a greater width than bottom surface (F341) of via conductor (322b), depth (D324) of recessed portion (R2) formed in land (312c) of via conductor (312b) tends to be greater than depth (D344) of recessed portion (R4) formed in land (322c) of via conductor (322b). Accordingly, the degree of flatness of the outermost layer laminated on the first-surface (F1) side of substrate 100 tends to be lower than that of the outermost layer laminated on the second-surface (F2) side of substrate 100.

If the degree of flatness of a base insulation layer is greater, or via conductors formed in the base insulation layer are smaller, it is easier to form on such a base insulation layer conductive patterns (including terminals for mounting electronic component or wiring board) that have a smaller L (line)/S (space) or a smaller terminal pitch. In the present embodiment, pads (P11) of the first-surface (F1) side form terminals for another wiring board (such as a motherboard) for which a high degree of flatness is not required, and pads (P12) on the second-surface (F2) side form terminals for IC chip 2001 for which a higher degree of flatness is required (see FIG. 3). The terminal pitch of IC chip 2001 mounted on pads (P12) is smaller than the terminal pitch of a motherboard mounted on pads (P11). Thus, wiring board 10 of the present embodiment is manufactured at a high yield. Also, according to the above structure, it is easier to form pads (P12) (terminals for IC chip 2001) at a fine pitch. In addition, according to the above structure, required mounting reliability is easier to secure when surface mounting on pads (P11) and (P12) respectively.

As shown in FIGS. 7 and 8, conductive layer 110 is made of metal foil (such as copper foil) (110a), electroless copper plating (110b), for example, and electrolytic copper plating (110c), for example, in wiring board 10 of the present embodiment. Via conductors (311b, 312b) are each made of electroless copper plating (110b), for example, and electrolytic copper plating (110c), for example. Electroless plating (110b) and electrolytic plating (110c) of conductive layer 110 as well as electroless plating (110b) and electrolytic plating (110c) of via conductor (311b) or (312b) are each formed to be integrated (contiguous). In the present embodiment, via conductor (313b) has the same structure as via conductor (311b) or (312b).

Also, conductive layer 120 is made of metal foil (such as copper foil) (120a), electroless copper plating (120b), for example, and electrolytic copper plating (120c), for example. Via conductors (321b, 322b) are each made of electroless copper plating (120b), for example, and electrolytic copper plating (120c), for example. Electroless plating (120b) and electrolytic plating (120c) of conductive layer 120 as well as electroless plating (120b) and electrolytic plating (120c) of via conductor (321b) or (322b) are each formed to be integrated (contiguous). In the present embodiment, via conductor (323b) has the same structure as via conductor (321b) or (322b).

Also, conductive layer 140 is made of metal foil (such as copper foil) (140a), electroless copper plating (140b), for example, and electrolytic copper plating (140c), for example. Via conductors (341b, 342b) are each made of electroless copper plating (140b), for example, and electrolytic copper plating (140c), for example. Electroless plating (140b) and electrolytic plating (140c) of conductive layer 140 as well as electroless plating (140b) and electrolytic plating (140c) of via conductor (341b) or (342b) are each formed to be integrated (contiguous). In the present embodiment, conductive layer 130 has the same structure as conductive layer 140. Via conductors (333b, 343b) each have the same structure as via conductor (341b) or (342b).

However, the above are not the only options. The layer structure (the number of layers and the material for each layer) of each conductive layer and each via conductor may be determined freely. For example, metal foil may be omitted.

As shown in FIG. 7, electrode 210 (only upper portion (210a) and lower portion (210c) are shown in FIG. 7) to which bottom surface (F311) of via conductor (311b) and bottom surface (F331) of via conductor (321b) are respectively connected is formed with first electrode layer 2101 and second electrode layer 2102. Also, as shown in FIG. 8, electrode 220 (only upper portion (220a) and lower portion (220c) are shown in FIG. 8) to which bottom surface (F321) of via conductor (321b) and bottom surface (F341) of via conductor (322b) are respectively connected is formed with first electrode layer 2201 and second electrode layer 2202. First electrode layers (2101, 2201) are each made of nickel, for example, and second electrode layers (2102, 2202) are each made of copper plating, for example. First electrode layers (2101, 2201) each function as a seed layer for forming (electrolytic plating) second electrode layers (2102, 2202), for example.

In wiring board 10 of the present embodiment, upper surface (F13) of conductive layer 301 (FIG. 2) and upper surface (F14) of conductive layer 302 (FIG. 2) are each roughened, while first electrode surface (F411) (FIG. 2) and second electrode surface (F412) (FIG. 2) of electrode 210, as well as first electrode surface (F421) (FIG. 2) and second electrode surface (F422) (FIG. 2) of electrode 220, are not roughened. Because of such a difference in roughening treatments, 10-point average roughness (Rzjis) on each of first electrode surfaces (F411, F421) and second electrode surfaces (F412, F422) is smaller than any 10-point average roughness (Rzjis) on upper surface (F13) of conductive layer 301 and upper surface (F14) of conductive layer 302.

In wiring board 10 of the present embodiment, upper surface (F13) of conductive layer 301 and upper surface (F14) of conductive layer 302 are each roughened to have a greater 10-point average roughness. Accordingly, it is easier to obtain a high degree of adhesiveness between conductive layer 301 and insulation layer 101 and between conductive layer 302 and insulation layer 102. In the present embodiment, upper surfaces of conductive layers (110, 120, 130, 140) each have the same degree of roughness as upper surface (F13) or (F14) of conductive layer 301 or 302. Thus, adhesiveness is improved between such upper surfaces and insulation layers or the like formed respectively thereon.

In the following, preferred examples of measurements in wiring board 10 of the present embodiment are shown.

In FIG. 5A, width (D21) in a longitudinal direction (direction X) of electronic component 200 is approximately 1000 µm, for example, and width (D22) in a lateral direction (direction Y) of electronic component 200 is approximately 500 µm, for example. Width (D23) of upper portion (210a) of electrode 210 is approximately 230 µm, for example. In the present embodiment, the width of lower portion (210c) of electrode 210 is the same as width (D23) of upper portion (210a).

The areas of upper portion (210a) and lower portion (210c) of electrode 210 (external electrode on first main surface (F31) and on second main surface (F32)) are each approximately 0.115 mm² (=230 µm×500 µm), for example. The areas of upper portion (210a) and lower portion (210c) of electrode 210 are each preferred to be 0.2 mm² or smaller.

In FIGS. 7 and 8, thickness (D201) of body 201 is approximately 110 µm, for example. Thickness (D211) of upper portion (210a) of electrode 210 and thickness (D221) of upper portion (220a) of electrode 220 are each approximately 15 µm, for example. Thickness (D212) of lower portion (210c) of electrode 210 and thickness (D222) of lower portion (220c) of electrode 220 are each approximately 15 µm, for example. In the present embodiment, the sum of thickness (D201) of body 201, thickness (D211) of upper portion (210a) of electrode 210 and thickness (D212) of lower portion (210c) of electrode 210 (hereinafter referred to as the first component thickness) is substantially the same as the sum of thickness (D201) of body 201, thickness (D221) of upper portion (220a) of electrode 220 and thickness (D222) of lower portion (220c) of electrode 220 (hereinafter referred to as the second component thickness). However, that is not the only option, and the first component thickness and the second component thickness may be different from each other.

In the present embodiment, the first component thickness or the second component thickness corresponds to thickness (D200) of electronic component 200. Here, if the first component thickness and the second component thickness are different from each other, the greater one corresponds to thickness (D200) of electronic component 200.

In the present embodiment, the measurements of electrode 220 are the same as those of electrode 210. However, that is not the only option, and electrode 210 and electrode 220 may have different measurements from each other.

In FIG. 6, pitch (D24) of via conductors (311b, 312b) is approximately 720 µm, for example. In the present embodiment, the pitch of via conductors (321b, 322b) is the same as pitch (D24).

In FIG. 6, width (D101) in a longitudinal direction (direction X) of cavity (R10) is approximately 1080 µm, for example, and width (D102) in a lateral direction (direction Y) of cavity (R10) is approximately 580 µm, for example. Clearance of electronic component 200 and cavity (R10) is approximately 80 µm (=width (D101)−width (D21)), for example, in a longitudinal direction (direction X), and approximately 80 µm (=width (D102)−width (D22)), for example, in a lateral direction (direction Y).

In FIG. 2, thickness (D10) of substrate 100 is approximately 150 µm, for example. Thickness (D11) of conductive layer 301 and thickness (D12) of conductive layer 302 are each approximately 15 µm, for example. In the present embodiment, thickness (D11) of conductive layer 301 is the same as thickness (D12) of conductive layer 302. However, that is not the only option, and their thicknesses may be different from each other.

In the present embodiment, the sum of thickness (D10) of substrate 100, thickness (D11) of conductive layer 301 and thickness (D12) of conductive layer 302 is greater than thickness (D200) of electronic component 200 including electrodes (210, 220). Accordingly, electronic component 200 is accommodated entirely in cavity (R10), making it less likely for electronic component 200 to receive impact.

In FIG. 2, thickness (D1) of insulation layer 101 and thickness (D2) of insulation layer 102 are each approximately 25 µm for example. In the present embodiment, thickness (D1) of insulation layer 101 is the same as thickness (D2) of insulation layer 102, for example. However, that is not the only option, and they may be different from each other.

In FIGS. 7 and 8, thickness (D110) of insulator (101a) is approximately 40 µm for example. Thickness (D110) of insulator (101a) corresponds to the difference (the amount of difference) between the height of upper surface (F13) of conductive layer 301 and the height of third surface (F3) (in particular, first electrode surfaces (F411, F421)) of electronic component 200 (see FIG. 2).

In FIG. 2, thickness (D3) of insulation layer 103 and thickness (D4) of insulation layer 104 are each approximately 25

μm, for example. In the present embodiment, thickness (D3) of insulation layer 103 is the same as thickness (D4) of insulation layer 104. However, that is not the only option, and they may be different from each other.

In FIG. 2, thickness (D13) of conductive layer 110, thickness (D14) of conductive layer 120, thickness (D15) of conductive layer 130, and thickness (D16) of conductive layer 140 are each approximately 15 μm, for example. Thickness (D13) of conductive layer 110, thickness (D14) of conductive layer 120, thickness (D15) of conductive layer 130, and thickness (D16) of conductive layer 140 are the same as each other, for example. However, that is not the only option, and they may be different from each other.

Here, the thickness of each conductive layer above is measured using the upper surface of its respective lower insulation layer (core substrate if it is a lower buildup section) as the base (zero), and the thickness of each insulation layer is measured using the upper surface of its respective lower conductive layer as the base (zero) (see FIG. 2).

In FIGS. 7 and 8, length (D311) of via conductor (311b) and length (D321) of via conductor (312b) are each approximately 65 μm, for example, and length (D331) of via conductor (321b) and length (D341) of via conductor (322b) are each approximately 50 μm, for example. In the present embodiment, length (D311) of via conductor (311b) is the same as length (D321) of via conductor (312b), and length (D331) of via conductor (321b) is the same as length (D341) of via conductor 322b). However, that is not the only option, and they may be different from each other.

In the present embodiment, length (D311) of via conductor (311b) is greater than length (D331) of via conductor (321b), and length (D321) of via conductor (312b) is greater than length (D341) of via conductor (322b) as described above.

In FIGS. 9~12, width (D312) on bottom surface (F311) of via conductor (311b) (FIG. 7) and width (D322) on bottom surface (F321) of via conductor (312b) (FIG. 8) are each approximately 80 μm, for example. Width (D332) on bottom surface (F331) of via conductor (321b) (FIG. 7), width (D342) on bottom surface (F341) of via conductor (322b) (FIG. 8), width (D372) on bottom surface (F371) of via conductor (313b) (FIG. 2), and width (D382) on bottom surface (F381) of via conductor (323b) (FIG. 2) are each approximately 60 μm, for example. In the present embodiment, widths (D312, D322) are the same as each other, and widths (D332, D342, D372, D382) are the same as each other. However, that is not the only option, and they may be different from each other.

In the present embodiment, width (D312) on bottom surface (F311) of via conductor (311b) is greater than width (D332) on bottom surface (F331) of via conductor (321b), and width (D322) on bottom surface (F321) of via conductor (312b) is greater than width (D342) on bottom surface (F341) of via conductor (322b) as described above.

In the present embodiment, the ratio of the width on the bottom surface to the length of a via conductor in each of via conductors (311b, 312b, 321b, 322b) (D312/D311, D322/D321, D332/D331, D342/D341) is approximately 1.2, for example.

In FIGS. 9~12, width (D313) on opening surface (F312) of hole (311a) (FIG. 7), and width (D323) on opening surface (F322) of hole (312a) (FIG. 8) are each approximately 105 μm, for example. Width (D333) on opening surface (F332) of hole (321a) (FIG. 7), width (D343) on opening surface (F342) of hole (322a) (FIG. 8), width (D373) on opening surface (F372) of hole (313a) (FIG. 2), and width (D383) on opening surface (F382) of hole (323a) (FIG. 2) are each approximately 75 μm, for example. In the present embodiment, widths (D313, D323) are the same as each other, and widths (D333, D343, D373, D383) are the same as each other. However, that is not the only option, and they may be different from each other.

In the present embodiment, width (D313) on opening surface (F312) of hole (311a) is greater than width (D333) on opening surface (F332) of hole (321a), and width (D323) on opening surface (F322) of hole (312a) is greater than width (D343) on opening surface (F342) of hole (322a) as described above.

In FIGS. 9~12, width (D316) of land (311c) of via conductor (311b) (FIG. 7) and width (D326) of land (312c) of via conductor (312b) (FIG. 8) are each approximately 155 μm, for example. Width (D336) of land (321c) of via conductor (321b) (FIG. 7), width (D346) of land (322c) of via conductor (322b) (FIG. 8), width (D376) of land (313c) of via conductor (313b) (FIG. 2), and width (D386) of land (323c) of via conductor (323b) (FIG. 2) are each approximately 120 μm, for example. In the present embodiment, widths (D316, D326) are the same as each other, and widths (D336, D346, D376, D386) are the same as each other. However, that is not the only option, and they may be different from each other.

In FIGS. 7 and 8, depth (D314) of recessed portion (R1) formed in land (311c) and depth (D324) of recessed portion (R2) formed in land (312c) are each approximately 20 μm, for example. Depth (D334) of recessed portion (R3) formed in land (321c) and depth (D344) of recessed portion (R4) formed in land (322c) are each approximately 2 μm, for example.

In the present embodiment, depth (D334) of recessed portion (R3) is smaller than depth (D314) of recessed portion (R1), and depth (D344) of recessed portion (R4) is smaller than depth (D324) of recessed portion (R2) as described above.

In the present embodiment, the ratio of depth (D334) of recessed portion (R3) to depth (D314) of recessed portion (R1) (D334/D314) is approximately 0.1, for example, and the ratio of depth (D344) of recessed portion (R4) to depth (D324) of recessed portion (R2) (D344/D324) is approximately 0.1, for example.

In FIGS. 9~12, opening width (D315) of recessed portion (R1) (FIG. 7) and opening width (D325) of recessed portion (R2) (FIG. 8) are each approximately 80 μm, for example. Opening width (D335) of recessed portion (R3) (FIG. 7), opening width (D345) of recessed portion (R4) (FIG. 8), opening width (D375) of recessed portion (R71) (FIG. 2), and opening width (D385) of recessed portion (R72) (FIG. 2) are each approximately 20 μm, for example. In the present embodiment, widths (D315, D325) are the same as each other, and widths (D335, D345, D375, D385) are the same as each other. However, that is not the only option, and they may be different from each other.

In the present embodiment, opening width (D335) of recessed portion (R3) is smaller than opening width (D315) of recessed portion (R1), and opening width (D345) of recessed portion (R4) is smaller than opening width (D325) of recessed portion (R2) as described above.

Figure 14:
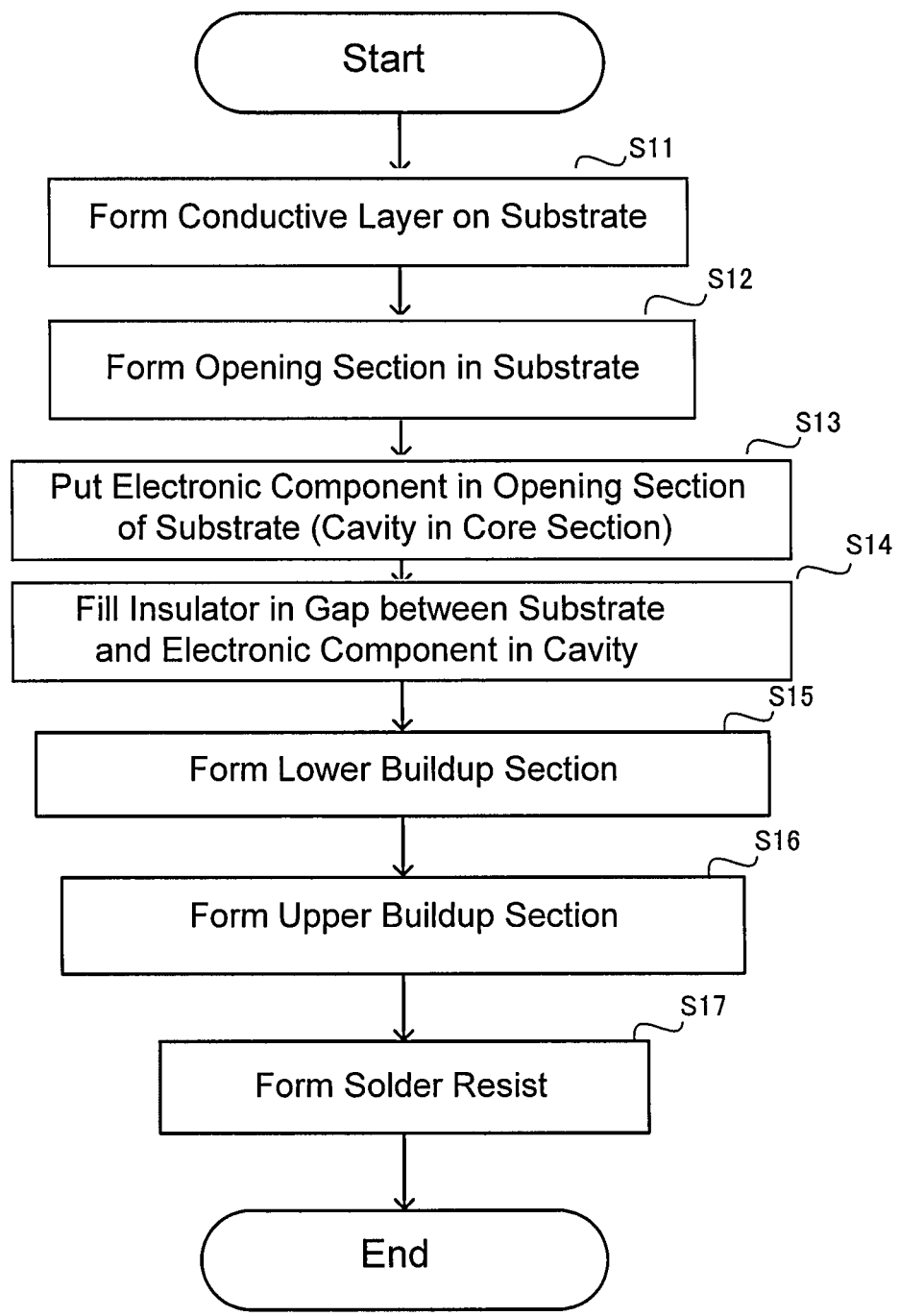
FIG. 14 is a flowchart showing a method for manufacturing a wiring board according to the embodiment of the present invention.

In the following, a method for manufacturing wiring board 10 of the present embodiment is described. FIG. 14 is a flowchart schematically showing the contents and order of a method for manufacturing wiring board 10 of the present embodiment.

In step (S11) of FIG. 14, a core substrate is prepared for wiring board 10, and conductive layers are formed on both of its surfaces.

Figure 15A:
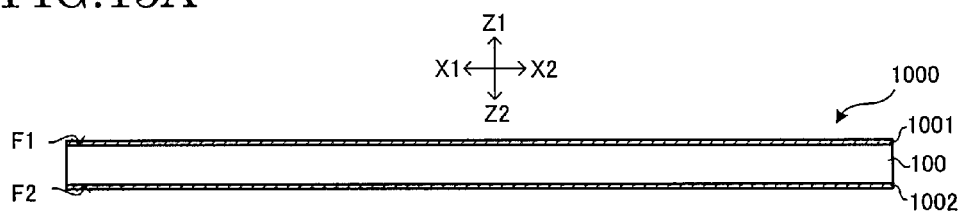
FIG. 15A, in the manufacturing method shown in FIG. 14, is a view illustrating a first step for forming conductive layers on a substrate.

Specifically, as shown in FIG. 15A, double-sided copper-clad laminate 1000 is prepared as a starting material. Double-sided copper-clad laminate 1000 is formed with substrate 100 (core substrate) having first surface (F1) and its opposing second surface (F2), metal foil 1001 (copper foil, for example) formed on first surface (F1) of substrate 100, and metal foil 1002 (copper foil, for example) formed on second surface (F2) of substrate 100. In the present embodiment, substrate 100 is made of completely cured (C-stage) glass epoxy at this stage.

Figure 15B:
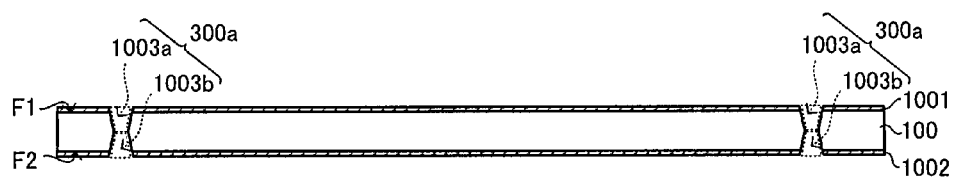
FIG. 15B, in the manufacturing method shown in FIG. 14, is a view illustrating a second step for forming conductive layers on the substrate.

As shown in FIG. 15B, using a $CO_2$ laser, for example, hole (1003*a*) is formed by irradiating the laser on double-sided copper-clad laminate 1000 from the first-surface (F1) side, and hole (1003*b*) is formed by irradiating the laser on double-sided copper-clad laminate 1000 from the second-surface (F2) side. Holes (1003*a*, 1003*b*) are formed at substantially the same position on the X-Y plane and then connected to make through hole (300*a*) that penetrates through double-sided copper-clad laminate 1000. Through hole (300*a*) is shaped like an hourglass, for example. The boundary of hole (1003*a*) and hole (1003*b*) corresponds to narrowed portion (300*c*) (FIG. 1). Laser irradiation on first surface (F1) and laser irradiation on second surface (F2) may be conducted simultaneously or separately. Desmearing is preferred to be conducted on through hole (300*a*) after through hole (300*a*) has been formed. Unwanted conduction (short circuiting) is suppressed by desmearing. Also, to enhance the absorption efficiency of laser light, a black-oxide treatment may be conducted on surfaces of metal foils (1001, 1002) prior to laser irradiation. Here, through hole (300*a*) may be formed by a drill or through etching instead of using a laser. However, it is easier to perform fine processing using a laser.

Figure 15C:
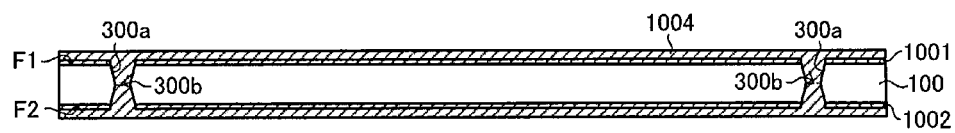
FIG. 15C, in the manufacturing method shown in FIG. 14, is a view illustrating a third step for forming conductive layers on the substrate.

Using panel plating, for example, copper plating 1004, for example, is formed on metal foils (1001, 1002) and in through hole (300*a*) as shown in FIG. 15C. Specifically, plating 1004 is formed by performing electroless plating first, and then by performing electrolytic plating in a plating solution using the electroless plated film as a seed layer. Accordingly, plating 1004 is filled in through hole (300*a*), and through-hole conductor (300*b*) is formed.

Each conductive layer formed on first surface (F1) or second surface (F2) of substrate 100 is patterned using an etching solution and an etching resist which is patterned by a lithographic technique, for example. Specifically, each conductive layer is covered by etching resist with a pattern corresponding to conductive layer 301 or 302, and portions of each conductive layer not covered by the etching resist (portions exposed through opening portions of the etching resist) are etched away. Such etching is not limited to a wet type, and a dry type may also be employed.

Figure 15D:
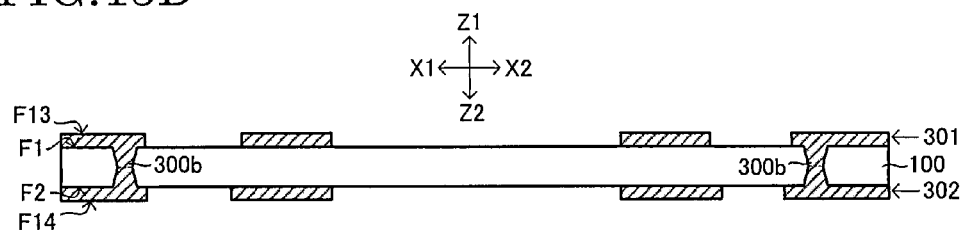
FIG. 15D, in the manufacturing method shown in FIG. 14, is a view illustrating a fourth step for forming conductive layers on the substrate.

Accordingly, conductive layer 301 is formed on first surface (F1) of substrate 100, and conductive layer 302 is formed on second surface (F2) of substrate 100 as shown in FIG. 15D. In the present embodiment, conductive layers (301, 302) each have a triple-layer structure of copper foil (lower layer), electroless copper plating (middle layer) and electrolytic copper plating (upper layer), for example. Alignment marks may be formed in conductive layer 301 or 302, for example, to be used in a later step (such as a step for positioning electronic component 200). In addition, the conductor in the portion corresponding to the shape of opening section (R100) may be removed from conductive layer 301 or 302 (see later-described FIGS. 17A and 17B).

Then, upper surface (F13) of conductive layer 301 and upper surface (F14) of conductive layer 302 are each roughened by chemical etching, for example, if required. However, that is not the only option, and the method for roughening may be selected freely. The etching may be wet or dry.

Figure 16:
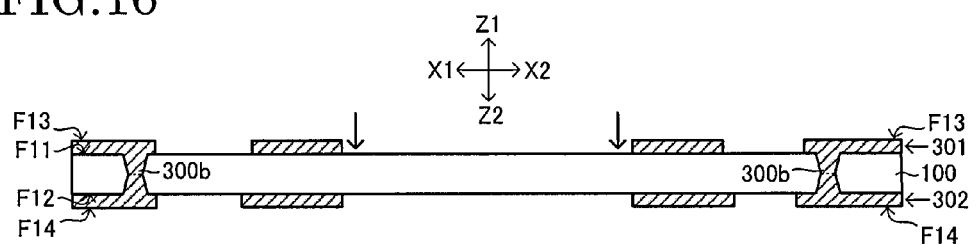
FIG. 16, in the manufacturing method shown in FIG. 14, is a view illustrating a step for forming a cavity in the substrate.
Figure 17A:
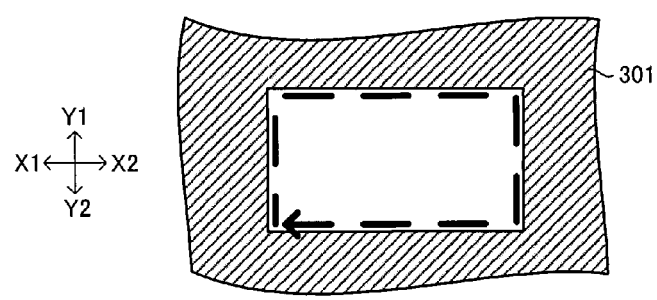
FIG. 17A, in the manufacturing method shown in FIG. 14, is a view illustrating a first example of laser irradiation in a step for forming a cavity in the substrate.
Figure 18:
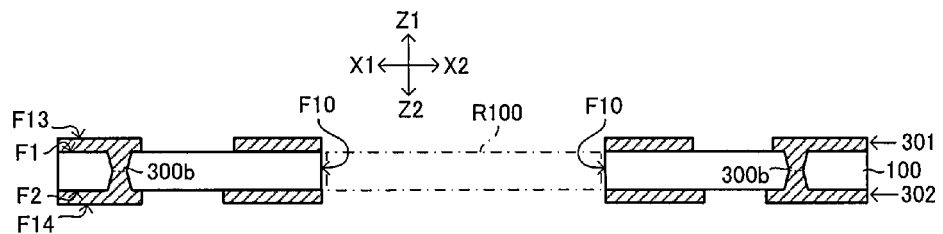
FIG. 18 is a plan view showing an opening section (cavity) formed in the substrate by steps shown in FIG. 14.

In step (S12) of FIG. 14, laser light is irradiated on substrate 100 from the first-surface (F1) side, for example, as shown in FIG. 16, to form opening section (R100) in substrate 100 which opens on first surface (F1) and second surface (F2) respectively (see FIG. 18). Specifically, as shown in FIG. 17A, for example, laser light is irradiated in a way to draw the shape of opening section (R100) (see FIG. 6) so that the region corresponding to opening section (R100) in substrate 100 is cut out from its surroundings. The angle to irradiate the laser is set to be substantially perpendicular to first surface (F11) of substrate 100, for example.

Figure 17B:
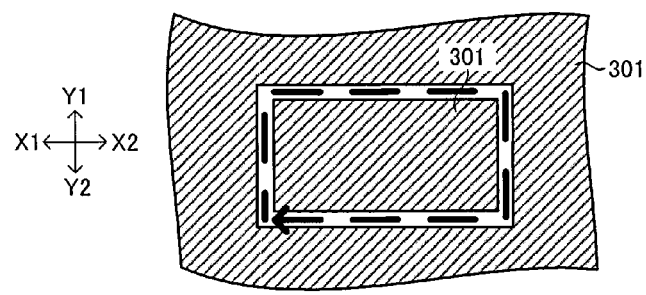
FIG. 17B, in the manufacturing method shown in FIG. 14, is a view illustrating a second example of laser irradiation in a step for forming a cavity in the substrate.

Prior to the above laser irradiation, it is preferred that conductive layer 301 on substrate 100 (if required, its opposing conductive layer 302 as well) be removed as shown in FIG. 17A, for example, so as to correspond to the shape of opening section (R100). Alternatively, conductive layer 301 on substrate 100 (if required, its opposing conductive layer 302 as well) may be removed along the laser irradiation path as shown in FIG. 17B. By processing conductive layer 301 as shown in FIG. 17A or 17B, it is easier to align laser irradiation since the position and shape of opening section (R100) are clear. Also, by removing the conductor from the processing portions, laser irradiation becomes easier.

When laser light is irradiated on substrate 100 from the first-surface (F11) side, the amount of laser processing decreases toward the second-surface (F12) side, and the cut surfaces of substrate 100 tend to taper. However, when substrate 100 is thin, it is easier to obtain cut surfaces substantially perpendicular to the main surface (first surface (F11) or second surface (F12)) of substrate 100.

When opening section (R100) (cavity) is formed, laser light may be irradiated only from one side of substrate 100 or may be irradiated simultaneously from both sides of substrate 100. Alternatively, after a hole with a bottom (non-penetrating hole) is formed by irradiating laser light from one side of substrate 100, laser light may be irradiated from the other side to penetrate through the bottom so that opening section (R100) (cavity) is formed.

If necessary, a black-oxide treatment is preferred to be conducted prior to laser irradiation. The method for forming opening section (R100) is not limited to using a laser, and a die, for example, may also be used. Also, after opening section (R100) is formed, desmearing or soft etching is preferred to be conducted if necessary.

Accordingly, as shown in FIG. 18, substrate 100 is obtained to have first surface (F1), its opposing second surface (F2) and opening section (R100) which penetrates from first surface (F1) to second surface (F2). In the present embodiment, opening section (R100) is made of a hole penetrating through substrate 100. Wall surfaces (F10) of substrate 100 facing opening section (R100) are substantially perpendicular to main surfaces of substrate 100, for example.

Opening section (R100) is formed as an accommodation space for electronic component 200. In the following, the section with a thickness from upper surface (F13) of conductive layer 301 to upper surface (F14) of conductive layer 302 (accommodation space for electronic component 200) is referred to as cavity (R10).

In step (S13) of FIG. 14, electronic component 200 is accommodated in cavity (R10) of substrate 100.

Figure 19:
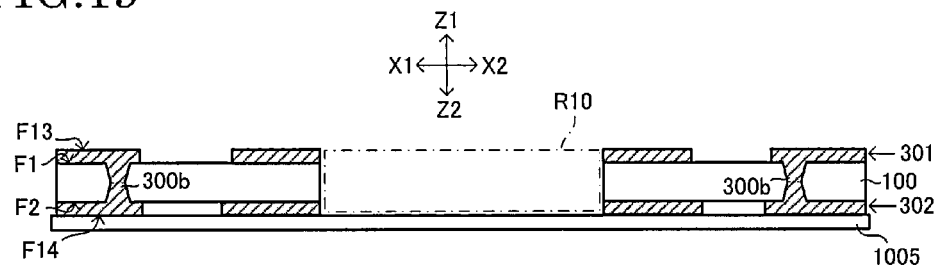
FIG. 19, in the manufacturing method shown in FIG. 14, is a view illustrating a step for attaching a carrier to the substrate where a cavity is formed.

Specifically, as shown in FIG. 19, carrier 1005 made of PET (polyethylene terephthalate), for example, is provided on one side of substrate 100 (second surface (F2), for example). In doing so, one opening of cavity (R10) (hole) is covered by carrier 1005. In the present embodiment, carrier 1005 is an adhesive sheet (tape, for example), and is adhesive on the substrate 100 side. Carrier 1005 is adhered to substrate 100 (in particular, conductive layer 302) through lamination, for example.

Figure 20:
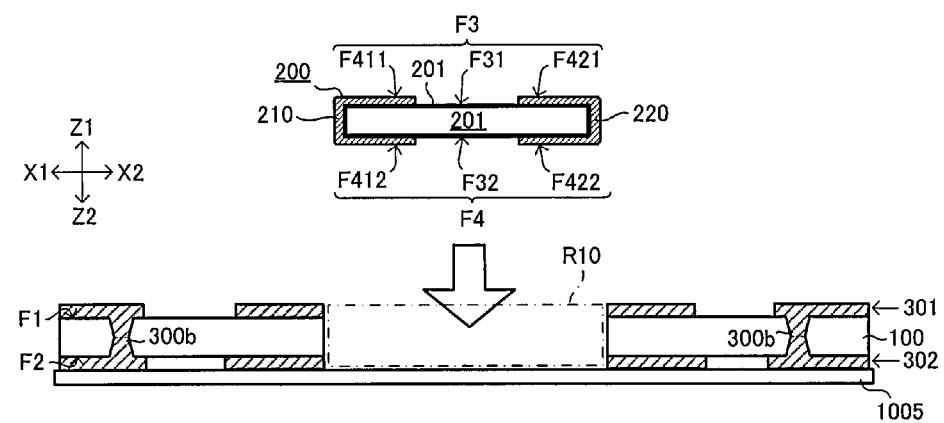
FIG. 20, in the manufacturing method shown in FIG. 14, is a view illustrating a step for accommodating an electronic component in the cavity.

As shown in FIG. 20, electronic component 200 is put into cavity (R10) from the side (the Z1 side) opposite the covered opening of cavity (R10) (hole).

First, electronic component 200 is prepared. Electronic component 200 has body 201 having first main surface (F31) and its opposing second main surface (F32), and electrodes (210, 220) (each an external electrode) formed on body 201. On first main surface (F31) and second main surface (F32) of body 201, portions of an external electrode (electrode 210 or 220) (upper portion (210*a*) and lower portion (210*c*), or upper portion (220*a*) and lower portion (220*c*)) are formed.

In the present embodiment, the thickness of electronic component 200 including external electrodes (electrodes (210, 220)) is smaller than the thickness of cavity (R10) (the sum of the thickness of substrate 100, the thickness of conductive layer 301 and the thickness of conductive layer 302).

Figure 21:
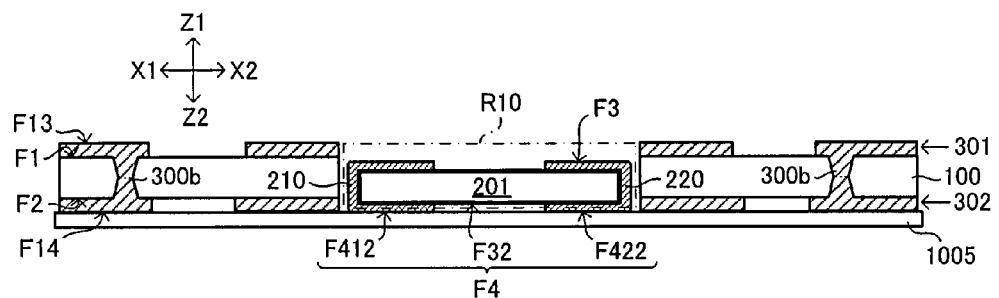
FIG. 21, in the manufacturing method shown in FIG. 14, is a view showing a state in which an electronic component is accommodated in the cavity.

Electronic component 200 prepared above is put into cavity (R10) using a component mounter, for example. For example, electronic component 200 is held by a vacuum chuck or the like, transported to a portion above cavity (R10) (the Z1 side), lowered in a perpendicular direction, put into cavity (R10), and placed on carrier 1005. Accordingly, electronic component 200 is positioned in cavity (R10) (opening section (R100)) with third surface (F3) facing the same direction as first surface (F1) as shown in FIG. 21.

In the present embodiment, upper surface (F14) of conductive layer 302 and fourth surface (F4) of electronic component 200 (in particular, later-described second electrode surfaces (F412, F422)) are each placed on a flat surface of carrier 1005. Therefore, they are at substantially the same height (Z coordinate) as each other, making a flush surface.

Figure 22:
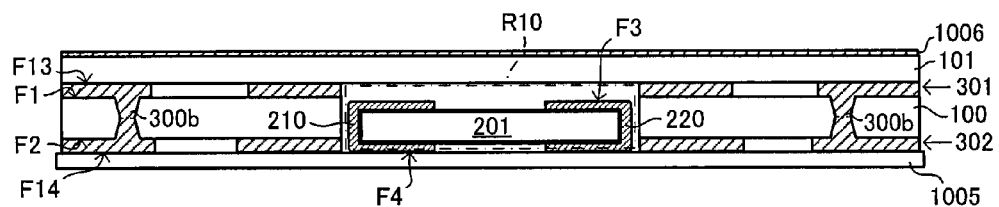
FIG. 22, in the manufacturing method shown in FIG. 14, is a view showing a first step for filling insulator in a gap between the substrate and an electronic component in the cavity.

In step (S14) of FIG. 14, semicured (B-stage) insulation layer 101 and metal foil 1006 (such as copper foil with resin) are formed on conductive layer 301 as shown in FIG. 22. Insulation layer 101 is made of prepreg of thermosetting glass epoxy, for example.

In the present embodiment, since the thickness of cavity (R10) is greater than the thickness of electronic component 200 including external electrodes, upper surface (F13) of conductive layer 301 and third surface (F3) of electronic component 200 (in particular, later-described first electrode surfaces (F411, F421)) are at different heights from each other (Z coordinates). Therefore, a gap is formed between insulation layer 101 and electronic component 200.

Figure 23:
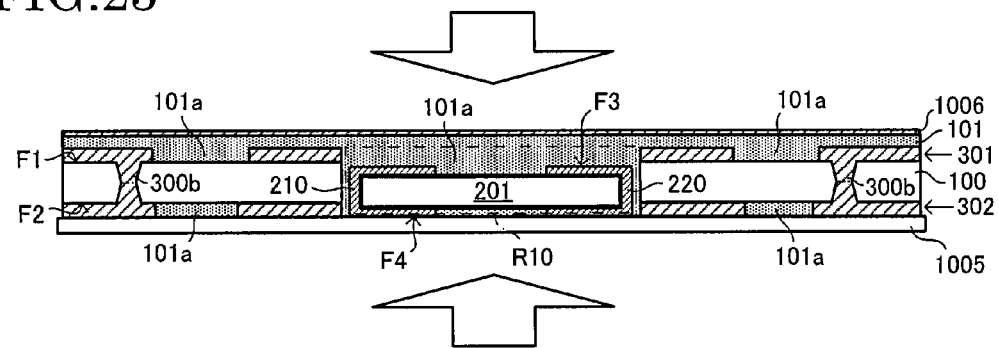
FIG. 23 is a view illustrating a second step subsequent to the step in FIG. 22.
Figure 24:
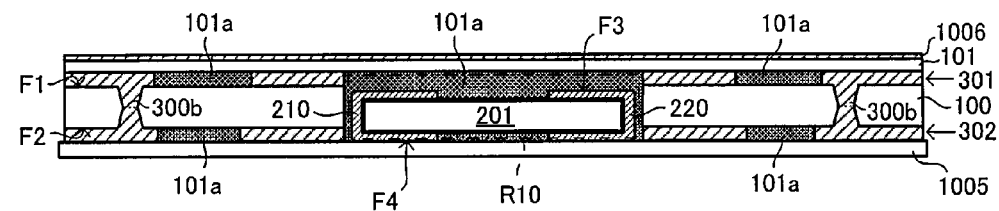
FIG. 24 is a view illustrating a third step subsequent to the step in FIG. 23.

As shown in FIG. 23, semicured insulation layer 101 is pressed so that resin flows out from insulation layer 101 into cavity (R10). Accordingly, insulator (101*a*) (resin from insulation layer 101) is filled between electronic component 200 in cavity (R10) and substrate 100 or insulation layer 101 as shown in FIG. 24.

Figure 25:
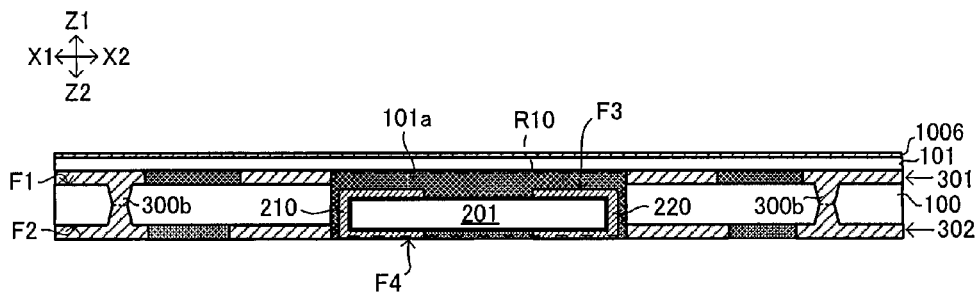
FIG. 25, in the manufacturing method shown in FIG. 14, is a view illustrating a step for removing the carrier from the substrate.

When insulator (101*a*) is filled in cavity (R10), the filler resin (insulator (101*a*)) and electronic component 200 are preliminarily adhered. In particular, filler resin is heated to a degree that it can support electronic component 200. By doing so, electronic component 200 supported by carrier 1005 is now supported by the filler resin. Then, carrier 1005 is removed as shown in FIG. 25.

At this stage, insulator (101*a*) (filler resin) and insulation layer 101 are only semicured, not completely cured. However, that is not the only option, and insulator (101*a*) and insulation layer 101 may be completely cured at this stage, for example.

In step (S15) of FIG. 14, lower buildup sections are formed.

Figure 26:
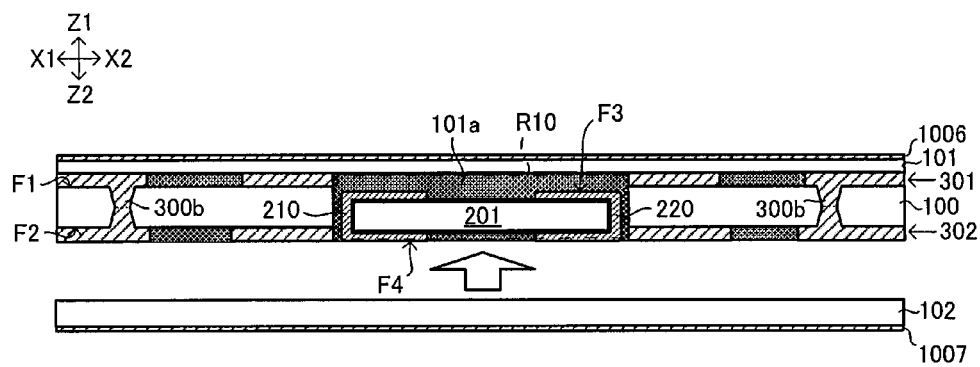
FIG. 26, in the manufacturing method shown in FIG. 14, is a view illustrating a first step for forming a lower buildup section.

Specifically, as shown in FIG. 26, insulation layer 102 and metal foil 1007 (such as copper foil with resin) are formed on conductive layer 302 and on electrodes (210, 220) of electronic component 200. Insulation layer 102 is made of prepreg of thermosetting glass epoxy, for example. Semicured (B-stage) insulation layer 102 is adhered to conductive layer 302 and electrodes (210, 220) by pressing, for example, and is heated so that insulation layers (101, 102) are each cured.

Figure 27:
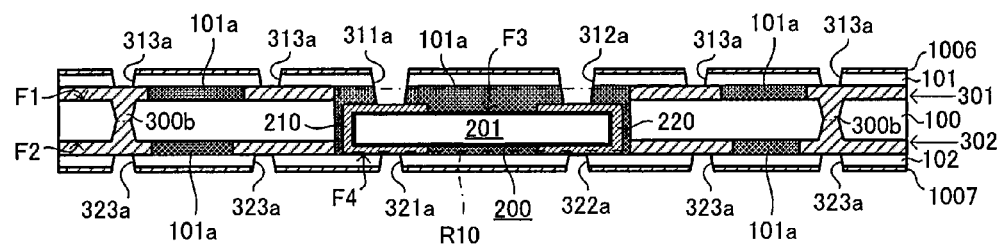
FIG. 27 is a view illustrating a second step subsequent to the step in FIG. 26.

Accordingly, an insulation layer (insulation layer 101 and insulator (101*a*)) is formed on first surface (F1) of substrate 100, on conductive layer 301 and on third surface (F3) of electronic component 200 (see FIG. 27). Also, an insulation layer (insulation layer 102 and insulator (101*a*)) is formed on second surface (F2) of substrate 100, on conductive layer 302 and on fourth surface (F4) of electronic component 200 (see FIG. 27).

In the present embodiment, insulation layers (101, 102) are cured at the same time. By simultaneously curing insulation layers (101, 102) formed on both surfaces of substrate 100, warping is suppressed in substrate 100. As a result, it is easier to make substrate 100 thinner.

Here, resin may be flowed out from insulation layer 102 by pressing so that the resin that has flowed out from insulation layer 102 may also form insulator (101*a*) along with the resin that has flowed out from insulation layer 101.

Also, the above pressing and thermal treatment may be divided into multiple procedures. In addition, the thermal treatment and pressing may be conducted separately or simultaneously.

In the present embodiment, electronic component 200 is entirely accommodated in cavity (R10). Therefore, impact is less likely to be exerted on electronic component 200 in cavity (R10) during the above pressing.

As shown in FIG. 27, holes (311*a*, 312*a*, 313*a*) (each a via hole) are formed in insulation layer 101 and metal foil 1006, and holes (321*a*, 322*a*, 323*a*) (each a via hole) are formed in insulation layer 102 and metal foil 1007 using a laser, for example. Holes (311*a*, 312*a*) each penetrate through metal foil 1006, insulation layer 101 and insulator (101*a*), and reach electrode 210 or 220 of electronic component 200. Hole (313*a*) penetrates through metal foil 1006 and insulation layer 101, and reaches conductive layer 301. Holes (321*a*, 322*a*) each penetrate through metal foil 1007 and insulation layer 102, and reach electrode 210 or 220 of electronic component 200. Hole (323*a*) penetrates through metal foil 1007 and insulation layer 102, and reaches conductive layer 302. Then, desmearing is conducted if required.

Since upper surfaces of electrodes 210 and 220 are not roughened in the present embodiment, high reflectance is maintained on upper surfaces of electrodes 210 and 220. Thus, damage from the laser is thought to be suppressed in electrodes 210 and 220 while forming the above via holes.

Figure 28:
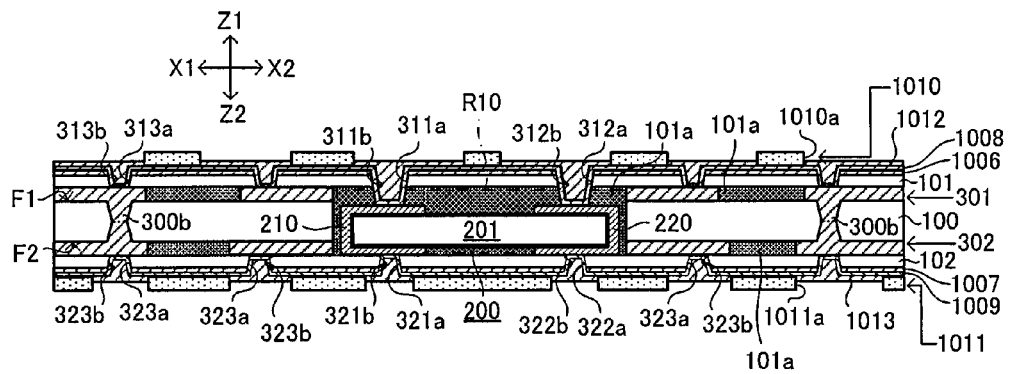
FIG. 28 is a view illustrating a third step subsequent to the step in FIG. 27.

Using a chemical plating method, for example, electroless copper-plated films (1008, 1009), for example, are formed on metal foils (1006, 1007) and in holes (311*a*~313*a*, 321*a*~323*a*) (see FIG. 28). Here, prior to electroless plating, a catalyst made of palladium or the like may be adsorbed on surfaces of insulation layers (101, 102) through immersion, for example.

Figure 29:
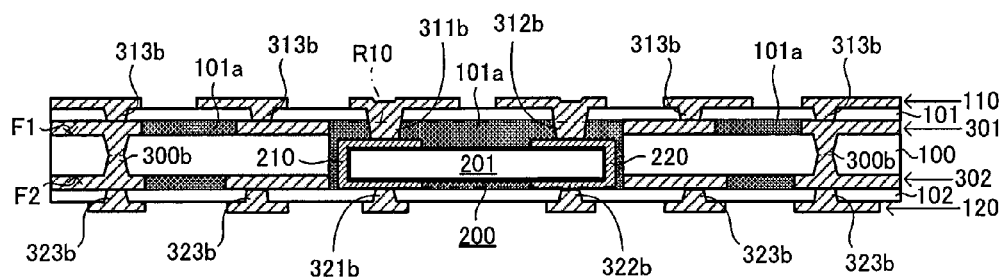
FIG. 29 is a view illustrating a fourth step subsequent to the step in FIG. 28.

Using a lithographic technique, printing or the like, plating resist 1010 with opening portions (1010*a*) is formed on the first-surface (F1) side main surface (on electroless plated film 1008), and plating resist 1011 with opening portions (1011*a*)

is formed on the second-surface (F2) side main surface (on electroless plated film 1009), (see FIG. 28). Opening portions (1010a, 1011a) are patterned corresponding to conductive layers (110, 120) respectively (FIG. 29).

As shown in FIG. 28, using a pattern plating method, for example, electrolytic copper platings (1012, 1013), for example, are respectively formed in opening portions (1010a, 1011a) of plating resists (1010, 1011). Specifically, copper as a plating material is connected to an anode, and electroless plated films (1008, 1009) as materials to be plated are connected to a cathode and immersed in a plating solution. Then, DC voltage is applied to flow current between both poles so that copper is deposited on surfaces of electroless plated films (1008, 1009). Accordingly, holes (311a~313a, 321a~323a) are filled with electroless plated film 1008 or 1009 and electrolytic plating 1012 or 1013, and via conductors (311b~313b, 321b~323b) made of copper plating, for example, are formed.

Then, using a predetermined removing solution, for example, plating resists (1010, 1011) are removed, and then unnecessary electroless plated films (1008, 1009) and metal foils (1006, 1007) are removed. Accordingly, conductive layers (110, 120) are formed as shown in FIG. 29. Upper surfaces of conductive layers (110, 120) are each roughened by chemical etching, for example. In the present embodiment, conductive layers (110, 120) each have a triple-layer structure of copper foil (lower layer), electroless copper plating (middle layer) and electrolytic copper plating (upper layer), for example. Accordingly, lower buildup sections are completed.

The seed layer for electrolytic plating is not limited to an electroless plated film. A sputtered film or the like may also be used as a seed layer instead of electroless plated films (1008, 1009).

Figure 30:
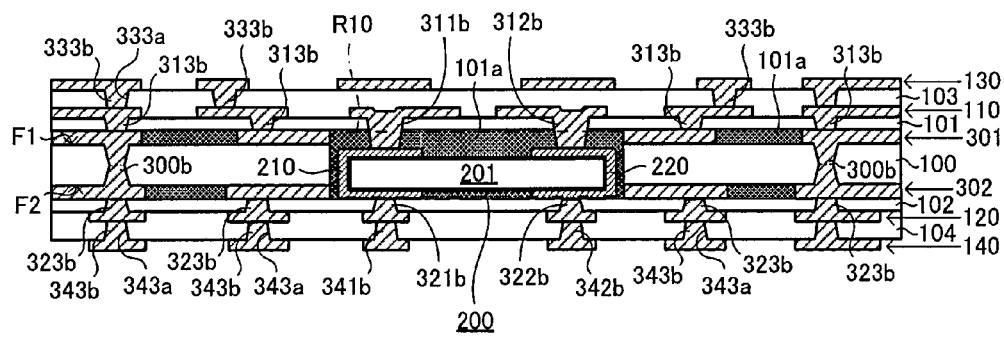
FIG. 30, in the manufacturing method shown in FIG. 14, is a view illustrating a step for forming upper buildup sections.

In step (S16) of FIG. 14, upper buildup sections are formed as shown in FIG. 30, for example. The upper buildup sections are formed the same as the lower buildup sections, namely, by laminating and pressing insulation layers and metal foils (such as copper foil with resin), curing resin, forming via conductors and forming conductive layers (including a roughening treatment).

In step (S17) of FIG. 14, solder resist 11 with opening portions (11a) and solder resist 12 with opening portions (12a) are respectively formed on insulation layers (103, 104) and conductive layers (130, 140) (see FIG. 1). Conductive layers (130, 140) are respectively covered by solder resists (11, 12) except for predetermined portions corresponding to opening portions (11a, 12a) (pads (P11, P12) or the like). Solder resists (11, 12) are formed, for example, by screen printing, spray coating, roll coating, lamination or the like.

Using electrolytic plating, sputtering or the like, anticorrosion layers made of Ni/Au film, for example, are formed on conductive layers (130, 140), in particular, on surfaces of pads (P11, P12) not covered by solder resists (11, 12) (see FIG. 1). Anticorrosion layers made of organic protective film may also be formed by conducting an OSP treatment.

Wiring board 10 of the present embodiment (FIG. 1) is completed through the procedures described above. Then, if required, electrical tests (to check capacitance, insulation and the like) are conducted on electronic component 200.

The manufacturing method according to the present embodiment is suitable for manufacturing wiring board 10. Using such a manufacturing method, an excellent wiring board 10 is thought to be obtained at low cost.

Wiring board 10 of the present embodiment can be used as a circuit board for mobile devices such as a cell phone. Pads (P11) of wiring board 10 are electrically connected to another wiring board (such as a motherboard) through soldering, for example. Also, IC chip 2001 (bear chip) can be flip-chip mounted on pads (P12) of wiring board 10 through soldering, for example, as shown in FIG. 3.

The present invention is not limited to the above embodiment, and may be modified as follows, for example.

Figure 31:
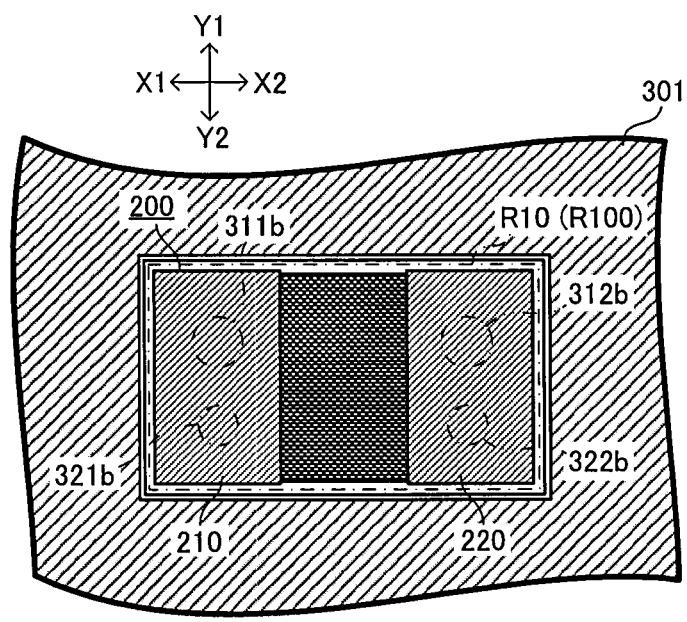
FIG. 31, in another embodiment of the present invention, is a view showing an example in which via conductors connected to both surfaces of an electronic component do not face each other.

Regarding at least either the via conductors connected to electrode 210 of electronic component 200 or the via conductors connected to electrode 220 of electronic component 200, a via conductor formed in insulation layer 101 and a via conductor formed in insulation layer 102 may be formed in positions not to face each other while sandwiching electronic component 200. Specifically, it is an option for via conductor (311b) and via conductor (321b) not to face each other while sandwiching electronic component 200 as shown in FIG. 31, for example. It is also an option for via conductor (312b) and via conductor (322b) not to face each other while sandwiching electronic component 200. In the example shown in FIG. 31, via conductor (311b) and via conductor (321b) are formed in positions not facing each other (different X-Y coordinates), and via conductor (312b) and via conductor (322b) are formed in positions not facing each other (different X-Y coordinates). According to such a structure, stress seldom concentrates locally in electronic component 200.

Figure 32:
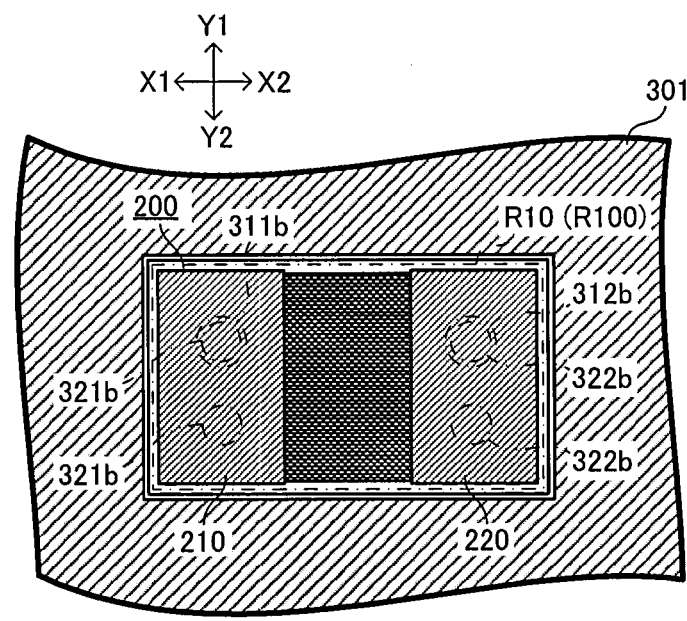
FIG. 32, in yet another embodiment of the present invention, is a view showing an example in which the numbers of via conductors connected to both surfaces of an electronic component are different from each other.

Regarding at least either the via conductors connected to electrode 210 or the via conductors connected to electrode 220, the number of via conductors formed in insulation layer 101 and the number of via conductors formed in insulation layer 102 may be different from each other. For example, as shown in FIG. 32, regarding at least either the via conductors connected to electrode 210 or the via conductors connected to electrode 220, the number of via conductors formed in insulation layer 101 may be smaller than the number of via conductors formed in insulation layer 102. In the example shown in FIG. 32, among the via conductors connected to electrode 210, one via conductor is formed in insulation layer 101 (via conductor 311b), and two via conductors are formed in insulation layer 102 (via conductors 321b). Also, among the via conductors connected to electrode 220, one via conductor is formed in insulation layer 101 (via conductor 312b), and two via conductors are formed in insulation layer 102 (via conductors 322b). According to such a structure, the number of longer via conductors on which thermal stress tends to be exerted is smaller than the number of shorter via conductors, and it is easier to keep connection reliability from lowering between electrodes of the electronic component and via conductors. Also, the number of via conductors connected to electrode 210 may be different from the number of via conductors connected to electrode 220.

Figure 33:
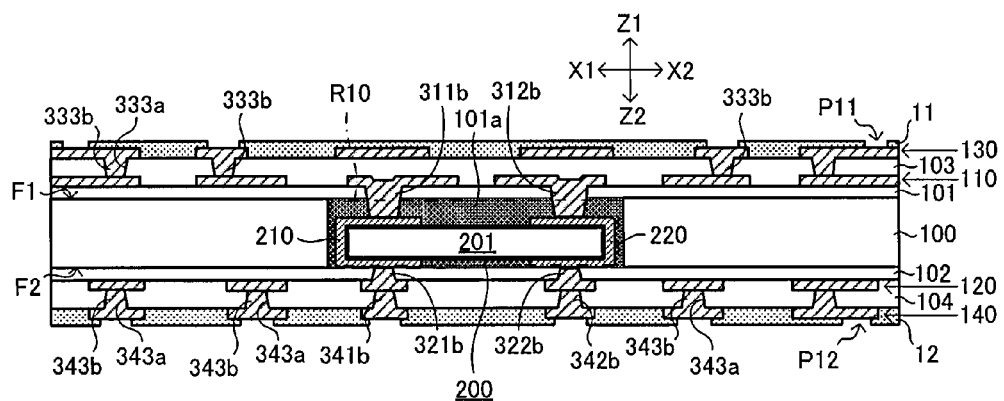
FIG. 33, in yet another embodiment of the present invention, is a view showing an example in which no conductive layer is formed on either main surface of the core substrate.

As shown in FIG. 33, it is an option to have no conductive layer formed on both surfaces (two main surfaces) of substrate 100. In the example shown in FIG. 33, the thickness of substrate 100 is greater than the thickness of electronic component 200, including electrode 210 (first side electrode) and electrode 220 (second side electrode). The thickness of substrate 100 corresponds to the thickness of cavity (R10).

Figure 34:
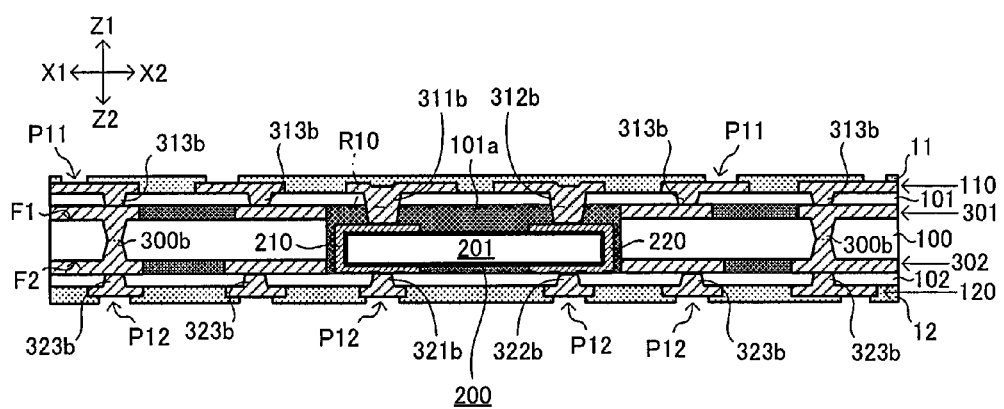
FIG. 34, in yet another embodiment of the present invention, is a view showing an example in which upper buildup sections are omitted.

The number of layers in a buildup section may be determined freely. For example, as shown in FIG. 34, upper buildup sections may be omitted. In the example shown in FIG. 34, conductive layers (110, 120) are each the outermost conductive layer and form pads (P11) or (P12) (external connection terminals) respectively.

Also, the number of layers in buildup sections may be different on the first-surface (F1) side of substrate 100 and on the second-surface (F2) side of substrate 100. However, to mitigate stress, it is considered preferable to make the number of layers in buildup sections the same on the first-surface (F1)

side of substrate 100 and on the second-surface (F2) side of substrate 100 so that the symmetry on the upper and lower surfaces is enhanced.

Figure 35:
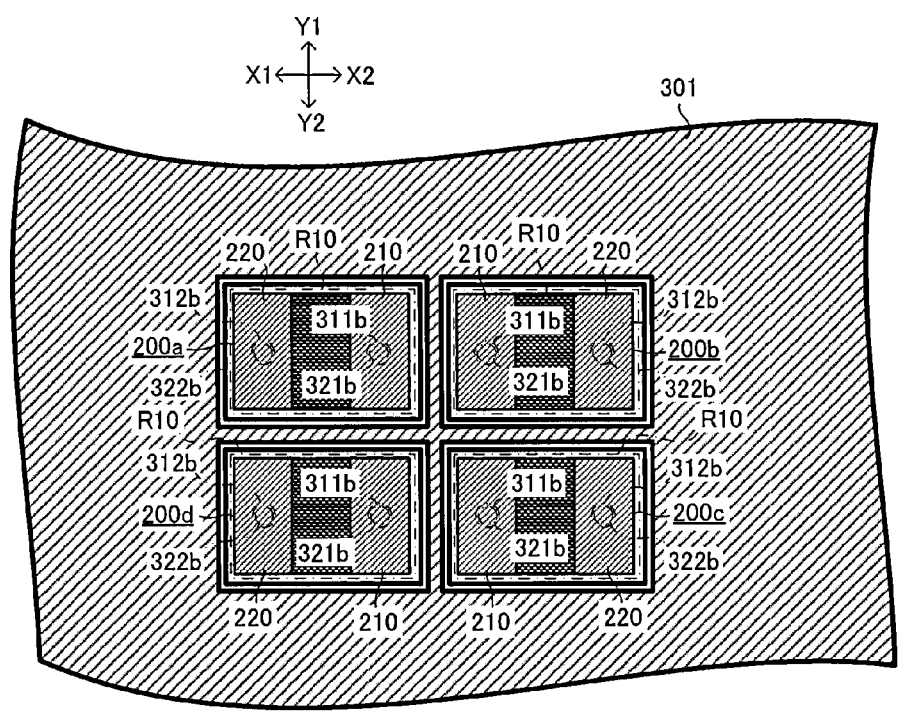
FIG. 35, in yet another embodiment of the present invention, is a view showing a wiring board with multiple built-in electronic components.

As shown in FIG. 35, a wiring board with multiple built-in electronic components (electronic components (200*a*, 200*b*, 200*c*, 200*d*), for example) may be obtained by forming multiple cavities (R10) in substrate 100, and by accommodating an electronic component in each cavity (R10). Alternatively, multiple electronic components may be accommodated in one cavity (R10).

The structure of wiring board 10, especially, the type, quality, measurements, material, shape, number of layers, positions and the like of its structural elements may be modified freely within a scope that does not deviate from the gist of the present invention.

The shape of electrodes of a chip capacitor to be accommodated in cavity (R10) (opening section) may be determined freely.

An electronic component to be accommodated in cavity (R10) (opening section) may be of any kind. Any electronic component, for example, active components such as an IC chip in addition to passive components such as a capacitor, resistor or coil, may be used. Also, the electronic component to be accommodated in cavity (R10) may be such that multiple elements (such as capacitors) are integrated (molded, for example).

Substrate 100 (the core substrate of a wiring board, for example) may be an insulative substrate with a built-in metal plate (copper foil, for example). In such substrate 100, heat dissipation is improved because of the metal plate.

Each via conductor, including via conductors connected to the electronic component, is not limited to being a filled conductor, and may be a conformal conductor, for example.

The planar shapes (X-Y plane) of via conductors, via holes, the electronic component and the cavity (accommodation section) may be determined freely. For example, they may be substantially a circle or substantially a polygon (such as substantially a rectangle, substantially a square, substantially a hexagon or substantially an octagon). Corners of such polygons may have any angle, for example, substantially right angles, acute or obtuse angles, or even be roundish. However, to reduce the size of a cavity for purposes of increasing wiring regions on the substrate, the planar shape (X-Y plane) of the cavity is preferred to correspond to the planar shape (X-Y plane) of an electronic component to be accommodated.

In the above embodiment, insulation layers (101, 102, 103, 104) are each made of resin that contains core material. However, that is not the only option. For example, to secure the flatness of each interlayer insulation layer, it is especially important to use resin that contains core material for forming insulation layers (101, 102) of lower buildup sections. Thus, even if insulation layers (103, 104) do not contain core material, as long as insulation layers (101, 102) contain core material, required flatness is most likely obtained. Also, if required flatness is secured, neither insulation layer 101, 102, 103 nor 104 is required to contain core material.

A method for manufacturing a wiring board is not limited to the order and contents shown in FIG. 14 above. The order and contents may be modified freely within a scope that does not deviate from the gist of the present invention. Also, some step may be omitted depending on usage or the like.

For example, the method for forming each conductive layer is not limited specifically. For example, any one or a combination of any two or more of the following may be used to form conductive layers: panel plating, pattern plating, full-additive, semi-additive (SAP), subtractive, transfer and tenting methods.

Wet or dry etching may be employed instead of using a laser. When etching is conducted, it is considered preferable to protect in advance by resist or the like a portion that is not required to be removed.

The above embodiment and modified examples may be combined freely. It is considered preferable to select an appropriate combination according to usage or the like. For example, via conductors of any wiring board shown in FIGS. 33~35 may be formed in such a way as shown in FIG. 31 or 32.

A wiring board with a built-in electronic component according to an embodiment of the present invention has the following: a substrate with a first surface and its opposing second surface, in which an opening section is formed to penetrate from the first surface to the second surface; an electronic component which is positioned in the opening section and has a third surface facing the same direction as the first surface and its opposing fourth surface as well as a first side electrode and its opposing second side electrode; a first insulation layer formed on the third surface of the electronic component; a second insulation layer formed on the fourth surface of the electronic component; a first via conductor formed in the first insulation layer whose bottom surface is connected to the first side electrode; a second via conductor formed in the first insulation layer whose bottom surface is connected to the second side electrode; a third via conductor formed in the second insulation layer whose bottom surface is connected to the first side electrode; and a fourth via conductor formed in the second insulation layer whose bottom surface is connected to the second side electrode. In such a wiring board, the first via conductor is set longer than the third via conductor, and the bottom surface of the first via conductor has a greater width than the bottom surface of the third via conductor, and the second via conductor is set longer than the fourth via conductor, and the bottom surface of the second via conductor has a greater width than the bottom surface of the fourth via conductor.

A method for manufacturing a wiring board with a built-in electronic component according to another embodiment of the present invention includes the following: preparing a substrate which has a first surface and its opposing second surface; forming an opening section in the substrate to penetrate from the first surface to the second surface; preparing an electronic component which has a third surface and its opposing fourth surface as well as a first side electrode and its opposing second side electrode; positioning the electronic component in the opening section formed in the substrate in such a way that the third surface faces the same direction as the first surface; forming a first insulation layer on the third surface of the electronic component; forming a second insulation layer on the fourth surface of the electronic component; in the first insulation layer, forming a first via conductor whose bottom surface is connected to the first side electrode; in the first insulation layer, forming a second via conductor whose bottom surface is connected to the second side electrode; in the second insulation layer, forming a third via conductor which is shorter than the first via conductor and has a bottom surface with a smaller width than the bottom surface of the first via conductor, and whose bottom surface is connected to the first side electrode; and in the second insulation layer, forming a fourth via conductor which is shorter than the second via conductor and has a bottom surface with a smaller width than the bottom surface of the second via conductor, and whose bottom surface is connected to the second side electrode.

According to an embodiment of the present invention, connection reliability between a side electrode of an electronic component and a via conductor is suppressed from decreasing in a thin wiring board with a built-in electronic component. Also, according to an embodiment of the present invention, manufacturing steps are suppressed from becoming complex when manufacturing a thin wiring board with a built-in electronic component. In addition, according to an embodiment of the present invention, a wiring board with a built-in electronic component seldom warps.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a substrate having an opening portion penetrating from a first surface of the substrate to a second surface of the substrate on an opposite side with respect to the first surface of the substrate;
an electronic component positioned in the opening portion and having a first side electrode and a second side electrode such that the first side electrode and the second side electrode extend from a first surface of the electronic component to a second surface of the electronic component on an opposite side with respect to the first surface of the electronic component;
a plurality of insulation layers including a first insulation layer formed over the first surface of the substrate and the first surface of the electronic component and a second insulation layer formed over the second surface of the substrate and the second surface of the electronic component; and
a plurality of via conductors including a first via conductor formed in the first insulation layer and having a bottom surface connected to the first side electrode, a second via conductor formed in the first insulation layer and having a bottom surface connected to the second side electrode, a third via conductor formed in the second insulation layer and having a bottom surface connected to the first side electrode, and a fourth via conductor formed in the second insulation layer and having a bottom surface connected to the second side electrode,
wherein the first via conductor has a length which is set longer than a length of the third via conductor, the bottom surface of the first via conductor has a width which is formed greater than a width of the bottom surface of the third via conductor, the second via conductor has a length which is set longer than a length of the fourth via conductor, the bottom surface of the second via conductor has a width which is greater than a width of the bottom surface of the fourth via conductor, each of the first via conductor, the second via conductor, the third via conductor and the fourth via conductor is made of a filled plated material, each of the first via conductor, the second via conductor, the third via conductor and the fourth via conductor has a land portion having a recessed portion, the recessed portion of the third via conductor has a depth which is set smaller than a depth of the recessed portion of the first via conductor, and the recessed portion of the fourth via conductor has a depth which is set smaller than a depth of the recessed portion of the second via conductor.

2. The wiring board according to claim 1, further comprising:
a first conductive layer formed on the first surface of the substrate; and
a second conductive layer formed on the second surface of the substrate,
wherein the plurality of via conductors includes a fifth via conductor formed in the first insulation layer and connected to the first conductive layer, and a sixth via conductor formed in the second insulation layer and connected to the second conductive layer, and the fifth via conductor and the sixth via conductor have lengths which are substantially the same.

3. The wiring board according to claim 1, further comprising an outermost conductive layer laminated on a second-surface side of the substrate and comprising a plurality of terminals positioned to mount an integrated circuit.

4. The wiring board according to claim 1, wherein the first via conductor has a ratio of the width of the bottom surface to the length of the first via conductor set in a range of 0.5 to 4.0, the second via conductor has a ratio of the width of the bottom surface to the length of the second via conductor set in a range of 0.5 to 4.0, the third via conductor has a ratio of the width of the bottom surface to the length of the third via conductor set in a range of 0.5 to 4.0, and the fourth via conductor has a ratio of the width of the bottom surface to the length of the fourth via conductor set in a range of 0.5 to 4.0.

5. The wiring board according to claim 1, wherein a ratio of the depth of the recessed portion of the third via conductor to the depth of the recessed portion of the first via conductor is set in a range of 0.03 to 0.5, and a ratio of the depth of the recessed portion of the fourth via conductor to the depth of the recessed portion of the second via conductor is set in a range of 0.03 to 0.5.

6. The wiring board according to claim 1, further comprising a via conductor stacked on one of the third via conductor and the fourth via conductor.

7. The wiring board according to claim 1, wherein the plurality of via conductors includes a plurality of via conductors connected to the first side electrode and a plurality of via conductors connected to the second side electrode, and the via conductors formed in the first insulation layer and the via conductors formed in the second insulation layer are different in numbers.

8. The wiring board according to claim 7, wherein the plurality of via conductors includes a plurality of via conductors connected to the first side electrode and a plurality of via conductors connected to the second side electrode, and the plurality of via conductors formed in the first insulation layer is set smaller in number than the plurality of via conductors formed in the second insulation layer.

9. The wiring board according to claim 1, wherein the plurality of via conductors includes a plurality of via conductors connected to the first side electrode and a plurality of via conductors connected to the second side electrode, and the plurality of via conductors formed in the first insulation layer and the plurality of via conductors formed in the second insulation layer are formed in positions such that the via conductors formed in the first insulation layer and the via conductors formed in the second insulation layer do not to face each other across the electronic component.

10. The wiring board with a built-in electronic component according to claim 1, further comprising:
a first conductive layer formed on the first surface of the substrate; and
a second conductive layer formed on the second surface of the substrate,
wherein the substrate, the first conductive layer and the second conductive layer have thicknesses whose sum is set greater than a thickness of the electronic component including the first side electrode and the second side electrode.

11. The wiring board according to claim 10, wherein the second conductive layer, the first side electrode and the second side electrode have surfaces which are made flush with respect to each other.

12. The wiring board according to claim 1, wherein the electronic component has a body having a first main surface, a second main surface on an opposite side with respect to the first main surface, a first side surface and a second side surface on an opposite side with respect to the first side surface, the first side electrode is formed on the body such that the first side electrode extends from the first main surface to the second main surface through the first side surface, and the second side electrode is formed on the body such that the second side electrode extends from the first main surface to the second main surface through the second side surface.

13. The wiring board according to claim 1, wherein the electronic component is a laminated ceramic capacitor.

14. A method for manufacturing a wiring board, comprising:
    forming an opening portion through a substrate such that the opening portion penetrates from a first surface of the substrate to a second surface of the substrate on an opposite side with respect to the first surface;
    positioning in the opening portion of the substrate an electronic component having a first side electrode and a second side electrode, the first side electrode and the second side electrode extending from a first surface of the electronic component to a second surface of the electronic component on an opposite side with respect to the first surface of the electronic component;
    forming on the substrate a plurality of insulation layers including a first insulation layer over the first surface of the substrate and the first surface of the electronic component and a second insulation layer over the second surface of the substrate and the second surface of the electronic component; and
    forming a plurality of via conductors including a first via conductor and a second via conductor in the first insulation layer such that the first via conductor has a bottom surface connected to the first side electrode and the second via conductor has a bottom surface connected to the second side electrode and a third via conductor and a fourth via conductor in the second insulation layer such that the third via conductor has a bottom surface connected to the first side electrode and the fourth via conductor has a bottom surface connected to the second side electrode,
    wherein the first via conductor has a length which is set longer than a length of the third via conductor, the bottom surface of the first via conductor has a width which is formed greater than a width of the bottom surface of the third via conductor, the second via conductor has a length which is set longer than a length of the fourth via conductor, the bottom surface of the second via conductor has a width which is greater than a width of the bottom surface of the fourth via conductor, each of the first via conductor, the second via conductor, the third via conductor and the fourth via conductor is made of a filled plated material, each of the first via conductor, the second via conductor, the third via conductor and the fourth via conductor has a land portion having a recessed portion, the recessed portion of the third via conductor has a depth which is set smaller than a depth of the recessed portion of the first via conductor, and the recessed portion of the fourth via conductor has a depth which is set smaller than a depth of the recessed portion of the second via conductor.

15. The method for manufacturing a wiring board according to claim 14, further comprising:
    forming a first conductive layer on the first surface of the substrate; and
    forming a second conductive layer on the second surface of the substrate,
    wherein the electronic component is formed such that the electronic component including the first side electrode and the second side electrode has a thickness which is set smaller than a sum of thicknesses of the substrate, the first conductive layer and the second conductive layer.

16. The method for manufacturing a wiring board according to claim 15, further comprising covering the opening portion of the substrate with a support member from a second-surface side of the substrate prior to the positioning of the electronic component, wherein the positioning of the electronic component includes placing the electronic component on the support member inside the opening portion from a first-surface side of the opening portion of the substrate.

17. The method for manufacturing a wiring board according to claim 15, wherein the forming of the plurality of insulation layers includes forming the first insulation layer such that a resin insulation layer is formed over the first surface of the electronic component and the first conductive layer and pressed to fill a gap between the resin insulation layer and the electronic component with a resin derived from the resin insulation layer.

* * * * *